(12) United States Patent
Anderson et al.

(10) Patent No.: US 11,067,657 B2
(45) Date of Patent: Jul. 20, 2021

(54) UNIFORM RADIO FREQUENCY MAGNETIC FIELDS IN THE BODY FOR HIGH FIELD MRI

(71) Applicant: VANDERBILT UNIVERSITY, Nashville, TN (US)

(72) Inventors: Adam W. Anderson, Nashville, TN (US); John Gore, Nashville, TN (US)

(73) Assignee: VANDERBILT UNIVERSITY, Nashville, TN (US)

( * ) Notice: Subject to any disclaimer, the term of this patent is extended or adjusted under 35 U.S.C. 154(b) by 974 days.

(21) Appl. No.: 15/490,597

(22) Filed: Apr. 18, 2017

(65) Prior Publication Data

US 2017/0299676 A1    Oct. 19, 2017

Related U.S. Application Data

(60) Provisional application No. 62/324,760, filed on Apr. 19, 2016.

(51) Int. Cl.
*G01R 33/44* (2006.01)
*G01R 33/565* (2006.01)
*G01R 33/48* (2006.01)
*G01R 33/36* (2006.01)

(52) U.S. Cl.
CPC ..... *G01R 33/5659* (2013.01); *G01R 33/4802* (2013.01); *G01R 33/3607* (2013.01)

(58) Field of Classification Search
CPC ............ G01R 33/4816; G01R 33/4818; G01R 33/482; G01R 33/4822; G01R 33/4824; G01R 33/4826; G01R 33/4828; G01R 33/483; G01R 33/4831; G01R 33/4833; G01R 33/4835; G01R 33/4836; G01R 33/4838; G01R 33/50; G01R 33/543; G01R 33/5602; G01R 33/5604; G01R 33/5605; G01R 33/5607; G01R 33/5608; G01R 33/561; G01R 33/5611; G01R 33/5612; G01R 33/5613; G01R 33/5614; G01R 33/5615; G01R 33/5616; G01R 33/5617; G01R 33/5618; G01R 33/5619; G01R 33/563; G01R 33/56308; G01R 33/56316;

(Continued)

(56) References Cited

U.S. PATENT DOCUMENTS

| | | | | |
|---|---|---|---|---|
| 5,551,430 | A * | 9/1996 | Blakeley | A61B 5/0555 324/318 |
| 8,779,772 | B2 * | 7/2014 | Froehlich | G01R 33/4802 324/318 |
| 10,126,383 | B2 * | 11/2018 | Blasche | G01R 33/3607 |
| 2005/0007133 | A1 * | 1/2005 | Hembree | H01L 21/67248 324/754.08 |
| 2006/0226840 | A1 * | 10/2006 | Chmielewski | G01R 33/3415 324/322 |
| 2008/0103700 | A1 * | 5/2008 | van den Berg | G01V 3/12 702/6 |

(Continued)

*Primary Examiner* — Tung X Nguyen
*Assistant Examiner* — Robert P Alejnikov, Jr.
(74) *Attorney, Agent, or Firm* — Blank Rome LLP

(57) ABSTRACT

Methods for operating a magnetic resonance apparatus and systems therefrom are provided. A method includes generating, via a coil former surrounding a subject or object of interest and disposed in the magnetic resonance apparatus, a plurality of field modes external to the subject or object, measuring for each of the plurality of external field modes, an associated internal field produced within the subject or object, generating, via the coil former a combination of external modes to produce a target internal field in the subject or object, and measuring nuclear magnetic resonance signals due to the resulting field from the combination to acquire an image or spectrum of the subject or object.

24 Claims, 22 Drawing Sheets

(58) Field of Classification Search
CPC ........ G01R 33/56325; G01R 33/56333; G01R 33/56341; G01R 33/5635; G01R 33/56358; G01R 33/56366; G01R 33/56375; G01R 33/56383; G01R 33/56391; G01R 33/565; G01R 33/56509; G01R 33/56518; G01R 33/56527; G01R 33/56536; G01R 33/56545; G01R 33/56554; G01R 33/56563; G01R 33/56572; G01R 33/56581; G01R 33/5659; G01R 33/567; G01R 33/5673; G01R 33/5676
USPC ........................................................ 324/309
See application file for complete search history.

(56) References Cited

U.S. PATENT DOCUMENTS

| | | | | |
|---|---|---|---|---|
| 2008/0129298 A1* | 6/2008 | Vaughan | ............ | G01R 33/5659 324/322 |
| 2009/0004748 A1* | 1/2009 | Ganesan | ................ | G01N 24/08 436/28 |
| 2011/0156704 A1* | 6/2011 | Boernert | ............ | G01R 33/3415 324/309 |
| 2013/0147475 A1* | 6/2013 | Yang | ................ | G01R 33/34046 324/309 |
| 2014/0232404 A1* | 8/2014 | Ferrand | .................. | G01R 33/34 324/318 |
| 2015/0309132 A1* | 10/2015 | Brown | ............ | G01R 33/34046 324/307 |
| 2017/0153801 A1* | 6/2017 | Kim | ..................... | A61B 5/7475 |

* cited by examiner

200

300

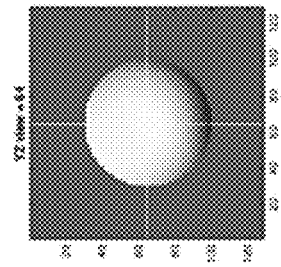
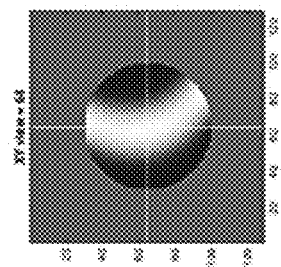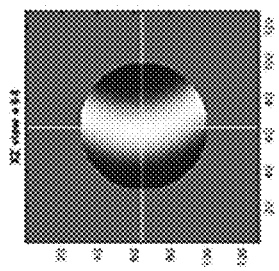
FIG. 16B
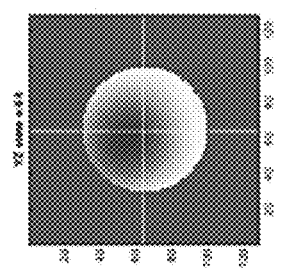
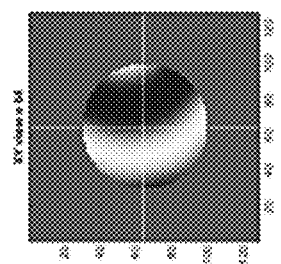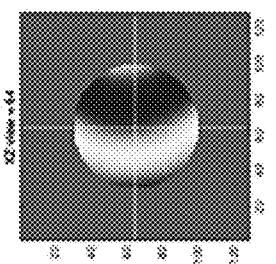
FIG. 16A

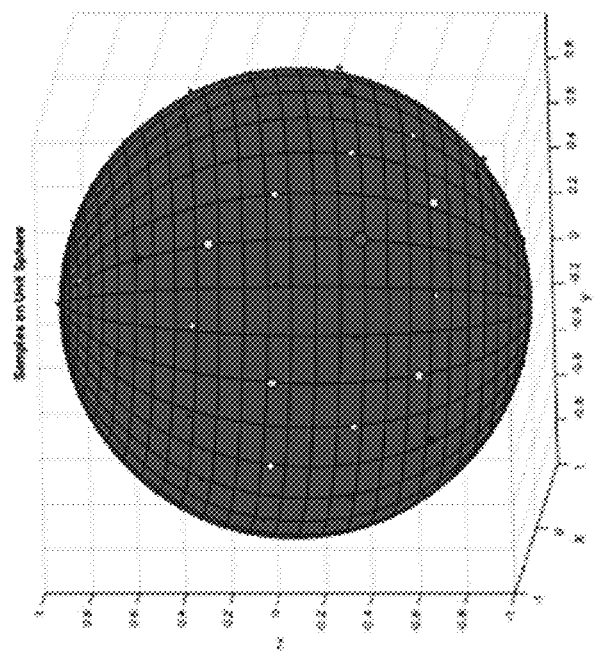
FIG. 16D
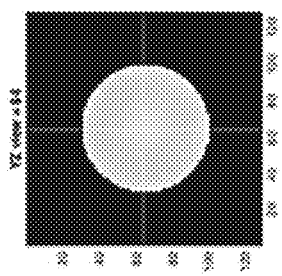
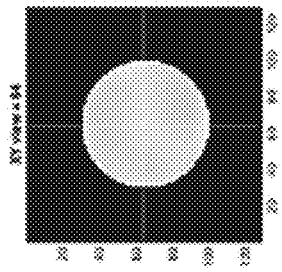
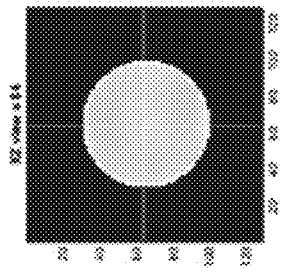
FIG. 16C

UNIFORM RADIO FREQUENCY MAGNETIC FIELDS IN THE BODY FOR HIGH FIELD MRI

CROSS-REFERENCE TO RELATED APPLICATIONS

This application claims priority to and the benefit of U.S. Provisional Patent Application No. 62/324,760, entitled "UNIFORM RADIO FREQUENCY MAGNETIC FIELDS IN THE BODY FOR HIGH FIELD MRI" and filed Apr. 19, 2016, the contents of which are incorporated by reference in their entirety as if fully set forth herein.

FIELD OF THE INVENTION

The present invention relates to magnetic resonance imaging (MRI), and more specifically to apparatus and methods for uniform radio frequency magnetic fields in the body for high field MRI.

BACKGROUND

As static magnetic field strength for MRI increases, the wavelength of the resonant $B_1$ field decreases. When the dimensions of the sample are not small compared to the wavelength (about 11 cm in vivo for 7 Tesla scanners), it is no longer possible to produce a uniform (in magnitude and phase) $B_1$ field in the head or body. This poses a challenge for high field MRI, because spatial variations in $B_1$ lead to non-uniform flip angles, image contrast and sensitivity. Several approaches have been proposed to mitigate this problem. Radio frequency (RF) shimming, $B_1$-insensitive and flip angle-correction RF pulse designs, parallel transmission, and traveling wave NMR have all shown promise for specific applications. However, a general solution for arbitrary flip angles, excitation bandwidths, sample volumes, and static field strengths has not yet been found.

Most current approaches attempt to mitigate the $B_1$ variations inherent in conventional RF coil designs. An exception is traveling wave NMR, which uses the scanner bore as a waveguide to support traveling waves for remote excitation and signal detection. This method can also in principle improve $B_1^+$ uniformity, because in a uniform traveling wave all points in space experience the same field amplitudes (although perhaps at different times in the oscillation cycle). In the absence of reflections, traveling waves do not produce the strong field variations associated with standing waves generated by conventional coils. However, a practical limitation of the method is that an ideal traveling wave in the bore is refracted and scattered at tissue interfaces with the result that the field within the body is no longer a uniform traveling wave, but has spatial variations determined by the body's electrical properties, shape and size.

SUMMARY

The various embodiments are directed to magnetic resonance imaging (MRI), and more specifically to apparatus and methods for uniform radio frequency magnetic fields in the body for high field MRI. In a first embodiment, there is provided a method for operating a magnetic resonance apparatus. The method includes the steps of generating, via a coil former surrounding a subject or object of interest and disposed in the magnetic resonance apparatus, a plurality of external field modes, measuring for each of the plurality of external field modes, an associated internal field produced within the subject or object, generating, via the coil former a combination of external modes to produce a target internal field in the subject or object, and measuring a nuclear magnetic resonance signal due to the combination of external modes to acquire an image or spectrum of the subject or object.

In the method, the target internal field can be one of a traveling wave or a superposition of traveling waves in the subject or object. The method can further include calculating, based on the measurements, the combination of external modes.

In the method, the coil former can include an array of dipoles, and the calculating can include calculating mode amplitudes and phases for the array of dipoles. Further, the generating can include producing a single radiofrequency (RF) pulse and distributing amplitude-modulated and phase-modulated copies of the single RF pulse to the array of dipoles according to the mode amplitudes and phases. The array of dipoles can be at least one of a plurality of magnetic dipoles or a plurality of electric dipoles.

In a second embodiment, there is provided a magnetic resonance apparatus that includes an apparatus body comprising a bore and a scanner, a coil former disposed in the bore and configured for surrounding a subject or object of interest in the bore. And a control system coupled to at least the coil former and the apparatus body, wherein the control system includes a processor and a computer-readable medium having stored thereon a plurality of instructions for causing the processor to perform steps. The steps include generating, via the coil former, a plurality of external field modes, measuring, via the scanner, for each of the plurality of external field modes, an associated internal field produced within the subject or object, generating, via the coil former, a combination of external modes to produce a target internal field in the subject or object, and measuring, via the scanner, the resulting signal due to the combination of modes to acquire an image or spectrum of the subject or object.

In the apparatus, the target internal field can be an internal field that produces at least one of a traveling wave or a superposition of traveling waves in the subject or object.

In the apparatus, the computer-readable medium can have stored thereon instructions for causing the processor to calculate, based on the measuring, the combination of external modes.

In the apparatus, the coil former can include an array of dipoles, and the calculating can include calculating mode amplitude and phases for the array of dipoles.

The apparatus can further include a modulation and distribution unit configured for receiving a single radiofrequency (RF) pulse and distributing amplitude-modulated and phase-modulated copies of the single RF pulse to the array of dipoles according to the mode amplitudes and phases.

In the apparatus, the array of dipoles can include at least one of a plurality of magnetic dipoles or a plurality of electric dipoles.

In a third embodiment, there is provided a non-transitory computer-readable medium, having stored a computer program executable by a computing device in a magnetic resonance apparatus. The computer program includes a plurality of code sections for causing the computing device to perform steps. The steps include generating, via a coil former surrounding a subject or object of interest and disposed in the magnetic resonance apparatus, a plurality of external field modes, measuring for each of the plurality of external field modes, an associated internal field produced within the subject or object, generating, via the coil former a combination of external modes to produce a target internal field in the subject or object, and measuring a nuclear magnetic resonance signal due to the combination of external modes to acquire an image or spectrum of the subject or object.

In the third embodiment, the target internal field is one of a traveling wave or a superposition of traveling waves in the subject or object.

In the third embodiment, the steps can further include calculating, based on the measurements, the combination of external modes.

In the third embodiment, wherein the coil former can include an array of dipoles, and wherein the calculating can include calculating mode amplitudes and phases for the array of dipoles. The generating can include producing a single radiofrequency (RF) pulse and distributing amplitude-modulated and phase-modulated copies of the single RF pulse to the array of dipoles according to the mode amplitudes and phases. Further, the array of dipoles can include at least one of a plurality of magnetic dipoles or a plurality of electric dipoles.

BRIEF DESCRIPTION OF THE DRAWINGS

(FIG. 12A) A map of |$H_y$| for a plane wave propagating from left to right (i.e., along the z axis) shows significant attenuation as a function of z, but good uniformity perpendicular to the direction of propagation. |$H_y$| is nearly uniform in planes of constant z. (FIG. 12B) The magnitude of $H_y$ along the z axis. Magnetic field units are A/m.

(FIG. 13A) |$H_x$| for the wave propagating toward the upper left of the image. (FIG. 13B) |$H_y$| for the wave propagating toward the lower right of the image. (FIG. 13C) Attenuation of each wave as a function of penetration depth is partially compensated by the other, producing a more uniform net transverse field, |$H_t$| (coefficient of variation <8% over the volume of the ellipsoid). The units are A/m.

FIGS. 16A-16D illustrate the benefits of combining plane waves of different amplitudes and orientations. Plane waves can be used to construct focused wave fronts (the real part of the $B_1^+$ field is shown in FIG. 16A, the imaginary part in FIG. 16B). The converging waves compensate for attenuation due to electrical conductivity of the medium. The magnitude of the $B_1^+$ field (shown in FIG. 16C) is nearly uniform over the volume of the conducting sphere—the coefficient of variation of $|B_1^+|$ is 2.7% over the volume. The relative amplitudes of the 46 plane waves used for this case are displayed on the surface of the unit sphere in FIG. 16D. Each plane wave is represented by a dot—the diameter of the dot is proportional to the wave amplitude, the gray scale intensity of the dot indicates phase, and the location of the dot on the sphere gives the propagation direction of the wave (in x, y, and z).

DETAILED DESCRIPTION

Figure 1:
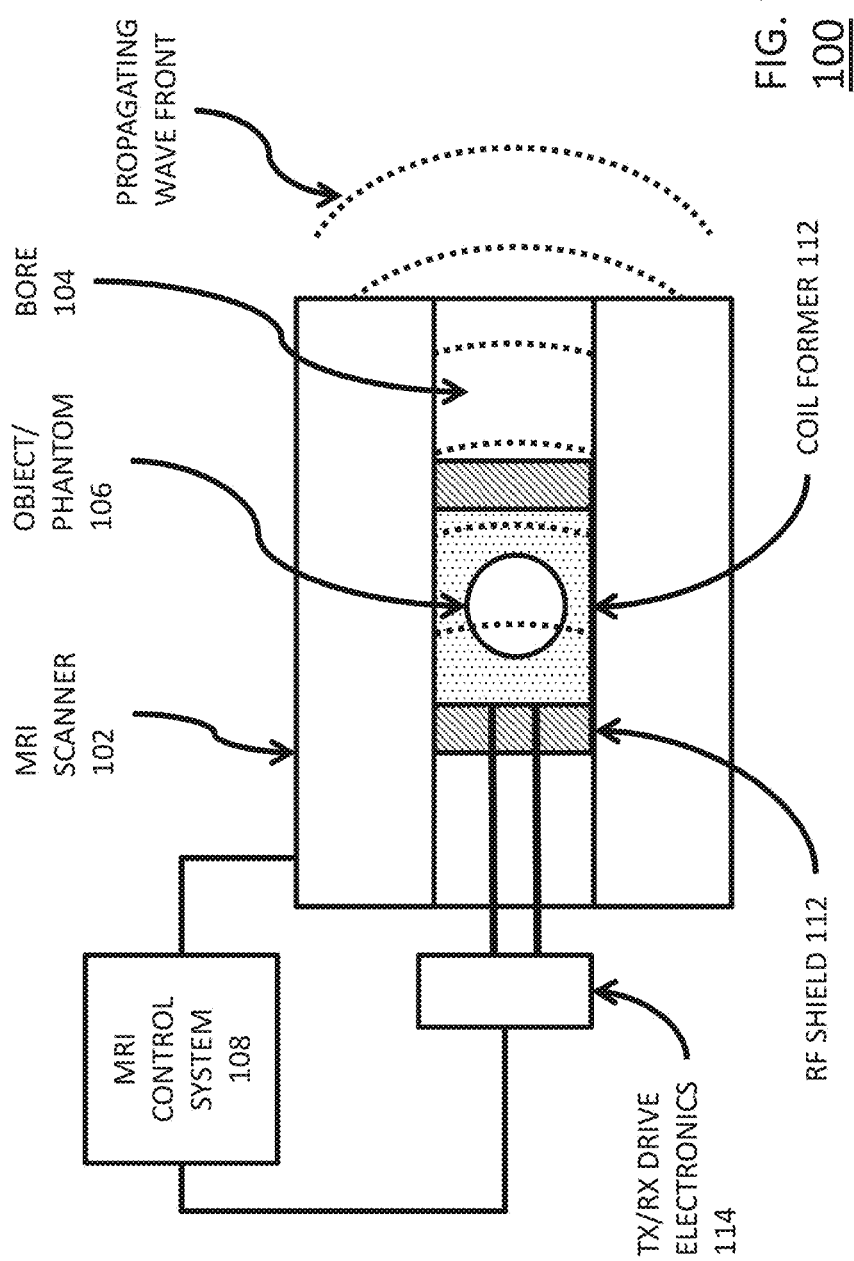
FIG. 1 shows a schematic diagram of a system in accordance with the various embodiments.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The various embodiments are directed to systems and methods for Traveling Internal Plane-wave Synthesis (TIPS). In particular, TIPS involves RF shimming with a complete set of basis functions (up to some maximum order) for generating an approximation of a traveling plane wave within a dielectric object. TIPS can be used to generate a nearly uniform-magnitude magnetic field in a spherical dielectric object (0.86% spatial variation, compared to 53% variation for an incident plane wave) in an ellipsoidal dielectric object (0.7% variation, compared to 63% for an incident plane wave). In dielectric conducting objects, TIPS can be used to produce a single plane wave that provides field uniformity over planar sections (≤1.6% variation within-plane). Hence, multi-planar 2D and multi-slab 3D imaging is enabled with TIPS. Furthermore, by superimposing multiple plane waves, TIPS can achieve nearly uniform-magnitude $B_1^+$ fields over the entire volume of conducting, dielectric objects (e.g., 2.7% variation over a 14 cm diameter sphere—see FIG. 16). Hence, TIPS allows simultaneous multislice and volume 3D imaging.

Although the TIPS method will be discussed primarily with respect to traveling waves or a superposition thereof, the various embodiments are not limited in this regard. That is, the general framework described herein can be used with any mode-based description of the electromagnetic field. Thus, a given target field can be described in terms of various options for the wave functions: plane waves, spherical waves, or cylindrical waves, for example. These descriptions are equivalent and any one of them can be used to define the field modes. In any case, the method uses the relationship between transmitted and internal modes to calculate the superposition of transmitted modes that produces the desired internal target field. Depending on the symmetry of the desired field, a particular set of modes (e.g., plane waves) may be more convenient than the alternatives.

There are at least five innovations in this work. First, independent control of individual modes of the internal electromagnetic field, through moderately high mode orders, has not been achieved previously. This level of control provides the means to synthesize any physically possible internal field (i.e., any solution of Maxwell's equations) to the same maximum order. Second, to provide independent control over field modes, a new RF coil design is necessary. The dense array of radial magnetic and electric dipoles uses radial magnetic dipoles to drive pure transverse-electric (TE) field modes and radial electric dipoles to drive pure transverse-magnetic (TM) field modes. Arrays of radial electric dipoles have not been used before in MRI coils, even though TM modes are necessary for full field control. More generally, the coil is able to transmit any physically possible field (up to a maximum mode order) to drive field modes within the body. Note that each radial dipole (indicated in FIGS. 14 and 15) can be replaced with three mutually orthogonal dipoles—driving these with appropriate amplitudes can produce a dipole field that is radial to any point within the coil volume. In this way the coil can create the desired field in off-center volumes of interest. Third, the electronic control of the dipole array requires driving circuits that would be useful for any large array of transmitting elements, including conventional arrays. Fourth, the new method aims to generate a specific, desired electromagnetic field in the body. It provides a solution to the inverse problem ('what transmitted field produces the target internal field?') in a physically motivated and computationally efficient manner. The target-field method is a general tool for creating internal fields with desired properties, including non-uniform fields for localized excitation, for example. Fifth, the theoretical framework provides a new approach to characterizing complex RF fields in MRI. It can be used, for example, to quantify the number of independent field modes that a given RF coil can drive. This will be particularly useful in evaluating competing designs of magnetic and electric dipole arrays, including conventional designs. It can also be used to quantify the complexity of fields in the body and assess the effects of tissue heterogeneity on field uniformity. These computational tools could lead to significant improvements in high field MRI.

In the various embodiments, the required incident field modes can be generated by arrays of magnetic and electric dipoles distributed over the surface of a coil former. The increase in field uniformity yields a similar improvement in the uniformity of flip angles experienced by spins in dielectric conducting objects.

The various embodiments also provide a method for independent control of electromagnetic field modes. Any solution of the electromagnetic field equations can be decomposed into a unique combination of field modes. The field modes can be divided into two types: those with transverse electric (TE) or transverse magnetic (TM) fields. Each mode represents a specific spatial variation of the field—higher order modes correspond to more rapid spatial variations. Although many dipole sources may be necessary to create a uniform |B1+| field in the body, this field corresponds to a much smaller number of field modes. Therefore, independent control of field modes (i.e., the ability to change the amplitude of one mode without affecting any other mode) offers practical advantages over independent control of dipole currents. For example, the number of required control signals will be dramatically lower for mode-based control versus dipole-based control. In addition, calibration (i.e., field mapping) will be more time-efficient. The method of radio frequency shimming in the various embodiments is similar to the way static field (B0) shimming is currently handled in MRI scanners—static field shims are designed to provide independent control of static field modes (solutions to the field equations for zero frequency). The following description describes a novel way to generalize this approach to radio frequency fields.

1. Environment

Turning first to FIG. 1, there is shown a general schematic for an MRI system 100 that can be configured in accordance with the various embodiments. The system 100 includes an MRI scanner 102 including the components for a typical MRI system, including but not limited to magnets, gradient coils, shim coils, radiofrequency (RF) coils, and a transmit/receive chain or scanner. The MRI scanner can also include a bore 104 in which a patient or other object of interest 106 (e.g., a phantom) is located for MRI scanning. Further, an MRI control system 108 can also be used to control the various components in the scanner.

In addition to the forgoing, the system 100 also includes a coil former 110, surrounding the object 106, and that is coupled to transmit/receive drive electronics 114. The coil former includes an array of magnetic and electric dipoles. An RF shield 112 is provided to ensure that other components in the MRI scanner do not affect the modes generated via the coil former 110. The drive electronics 114 can be controlled by the MRI control system 108. However, in some embodiments a separate control system that coordinates with MRI control system 108 can also be provided.

The basic operation of such components, unless otherwise specified herein, is described in U.S. Pat. No. 8,779,772, the contents of which are hereby incorporated by reference in their entirety as if fully set forth herein.

Figure 2:
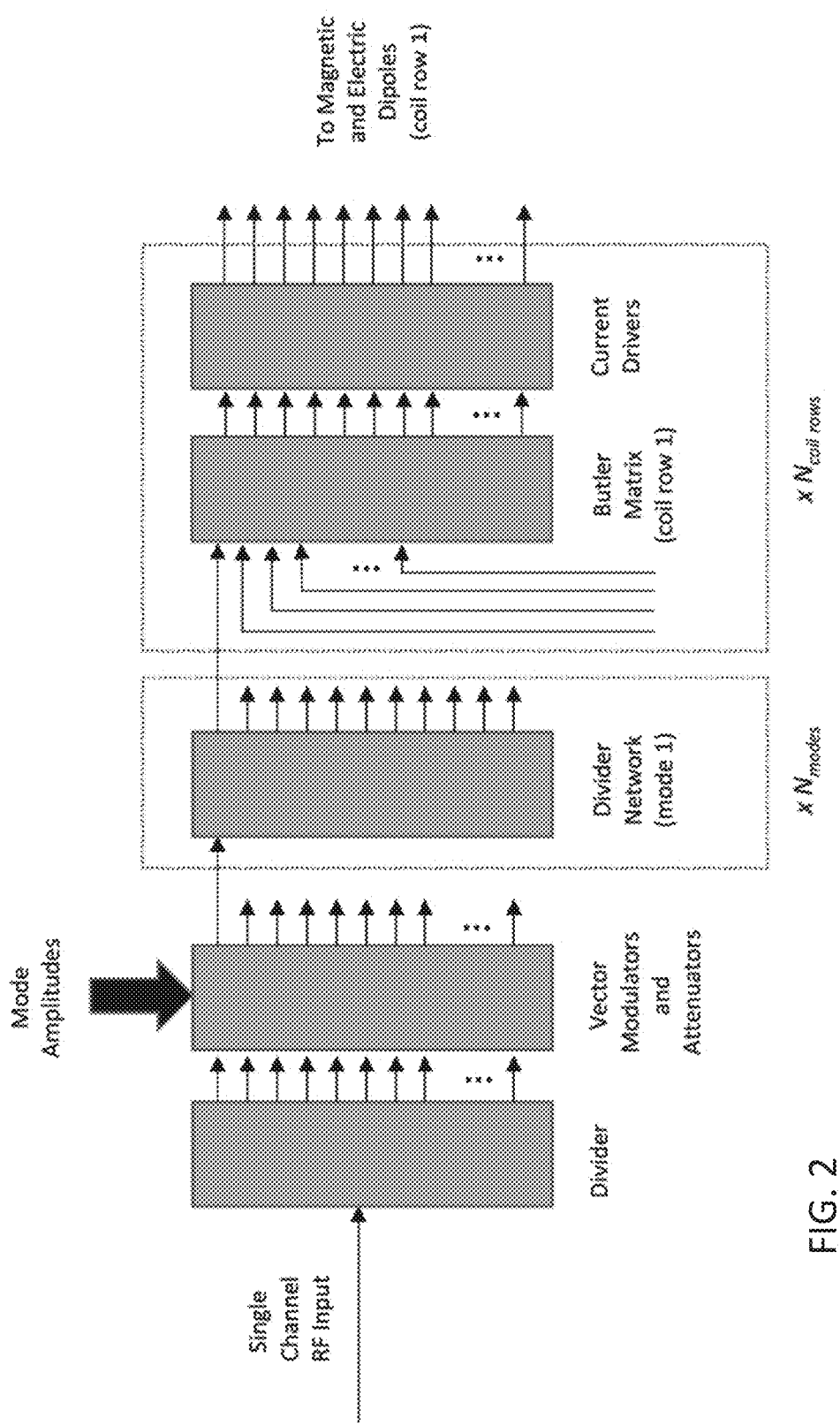
FIG. 2 shows a block diagram of a modulation and distribution unit in accordance with the various embodiments.

The drive electronics 114 can include or feed a modulation and distribution unit (MDU) for providing signals to the magnetic and electric dipoles of coil former. One exemplary configuration of such an MDU is illustrated in FIG. 2. As shown therein a single RF input is:

(1) Divided into ($N_{modes}$) equal signals, one for each external mode. In one configuration, $N_{modes}$=96.
(2) Each mode is amplitude and phase modulated (modulation is held constant during each scan), according to the (complex) amplitude of the mode.
(3) Each mode's signal is divided into ($N_{coilrows}$) non-equal signals, one for each row of the coil. This accounts for the r and theta dependence of the mode at the location of the coil row. In the example configuration, $N_{coilrows}$=11.
(4) The ($N_{modes}$) signals destined for coil row 1 are combined and distributed (to different dipoles) by the Butler matrix for coil row 1; and
(5) Voltage-controlled current sources drive the electrical current in each dipole in a coil row (in the example configuration, there are 24 magnetic+24 electric dipoles=48 dipoles).

Figure 3:
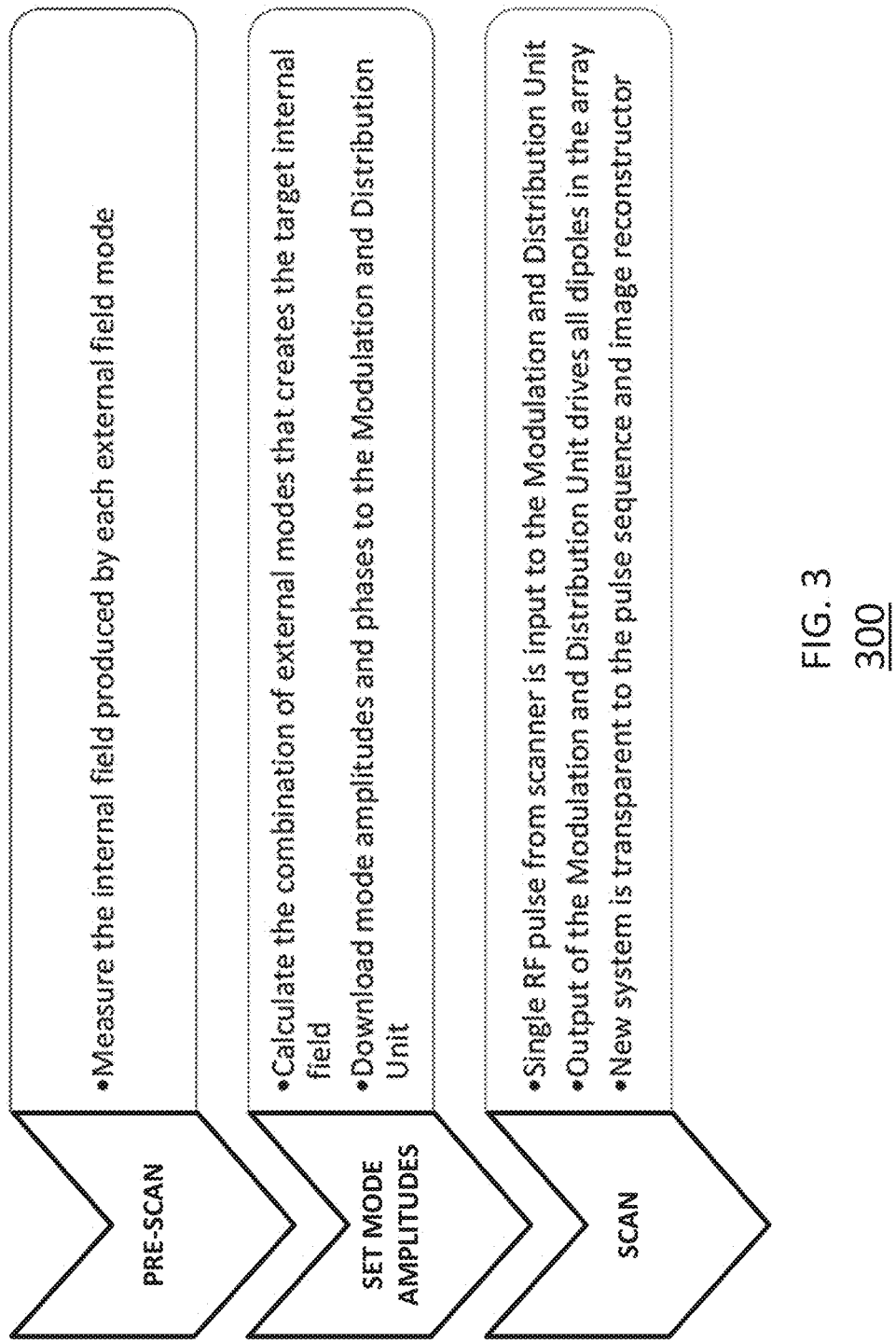
FIG. 3 shows a flowchart of steps in an exemplary method in accordance with the various embodiments.

A basic operation of the system 100 in accordance with the various embodiments is illustrated in FIG. 3, which shows steps in an exemplary flowchart 300 for performing a scan in accordance with the various embodiments.

First, at step 310, a pre-scan step is performed. That is, each external field mode is generated using the coil former 110, with the object 106 placed within the system 100, and a measurement of the internal field in the object 106 produced by each external field mode is obtained. Next at step 320, mode amplitudes are set. This involves calculating the combination of external modes necessary to generate a target internal field within the object 106, e.g., a traveling wave propagating through the object 106. This also involves setting the mode amplitudes and phases required in the MDU. Thereafter, at step 330, the scan of the object 106 is performed using system 100. This involves providing a single RF pulse to the MDU and using the output of the MDU to drive the magnetic and electric dipoles in the coil former 110. More details on the processes described above are provided below.

2. Theoretical Foundation

The various embodiments are directed to methods and systems for synthesizing specific target fields within dielectric conducting objects by appropriate combinations of external fields. A straightforward approach is to specify the desired transverse field at a set of points in the object and estimate the amplitudes of the external field modes that would produce such a target internal field. This can be posed algebraically as $$\tilde{H}_m \cdot \hat{u} = \tilde{H}_t \quad (1)$$

where the column vector $\tilde{H}_t$ specifies the target internal magnetic field values, the matrix $\tilde{H}_m$ gives the internal field values produced by each external mode, and $\hat{u}$ is the column vector of unknown external mode amplitudes. To be specific, suppose the x- and y-components of the magnetic field are specified at $N_V$ points within a volume of interest (VOI) in the object. The ($2N_V \times 1$) column vector $\tilde{H}_t$ holds the target values of $H_x$ in the first $N_V$ elements and $H_y$ in the last $N_V$ elements. If the RF transmit array can generate $N_{RF}$ independent field modes, then a general transmitted field can be specified by the ($N_{RF} \times 1$) column vector of (complex) mode amplitudes, $\hat{u}$. Finally, the transverse field values produced by unit amplitude of the $n^{th}$ transmit mode at each of the $N_V$ points appear in the $n^{th}$ column of $\tilde{H}_m$, which is the ($2N_V \times N_{RF}$) field mapping matrix ($H_x$ values in the first $N_V$ rows and $H_y$ values in the last $N_V$ rows). The transmit mode coefficients that generate the target field can be estimated using the least-squares solution $$\hat{u} = (\tilde{H}_m^\dagger \tilde{H}_m)^{-1} \tilde{H}_m^\dagger \cdot \tilde{H}_t \quad (2)$$

where $\tilde{H}_m^\dagger$ is the Hermitian conjugate of $\tilde{H}_m$. While these equations provide a formal statement and solution of the problem, they do not reveal what forms of the target field are physically achievable or what properties of the transmitted field modes are required to produce a given target field. These issues are addressed in the following sections. Although many types of target field could find applications in magnetic resonance, the focus here is on an internal traveling plane wave propagating in the z-direction, along the magnet bore, to be used for manipulating the magnetization in high field MRI. For clarity, derivations of quantities that are important for implementation, but not for a high-level understanding of the technique, are relegated to appendices.

The study of electromagnetic waves interacting with dielectric and/or conducting objects has a long history. When the dimensions of the object are on the order of a wavelength, the analysis is more complex than for objects either much smaller or much larger than a wavelength. General solutions based on Maxwell's equations were found independently by Gustav Mie and Peter Debye in the early 1900's. Applications of Mie Theory, as the basic approach is now known, have included the study of colloid suspensions, cytometry, radar measurements of rainfall, and characterization of interplanetary dust, among many others. Although originally applied to spherical objects, the basic theory has been extended to non-spherical and irregular objects. This section describes how the general theory can be used to improve the uniformity of $B_1$ for MRI of the human body at high field strengths. However, the same method applies to magnetic resonance studies of any object that is not small compared to the wavelength, as is often the case, for example, in electron paramagnetic resonance measurements. A Debye potential approach is used to find the incident harmonic electromagnetic field that produces a desired target field inside the object.

2.1 Parameterized Solutions to Maxwell's Equations

The first goal is to identify independent modes of the electromagnetic field produced by a transmitting RF source such as a coil array. Maxwell's equations are $$\nabla \times \vec{H} - \dot{\vec{D}} = \vec{J}$$

$$\nabla \times \vec{E} + \dot{\vec{B}} = 0$$

$$\nabla \cdot \vec{D} = \rho$$

$$\nabla \cdot \vec{B} = 0 \quad (3)$$

where a dot over a vector denotes differentiation with respect to time. For linear isotropic media with electric permittivity $\varepsilon$, magnetic permeability $\mu$, and conductivity $\sigma$, the material equations are $$\vec{D} = \varepsilon \vec{E}$$

$$\vec{B} = \mu \vec{H}$$

$$\vec{J} = \sigma \vec{E} \quad (4)$$

Assuming the time dependence of all fields is given by $\exp(-i\omega t)$, Eq. (3) becomes $$\nabla \times \vec{H} = -(i\varepsilon\omega - \sigma)\vec{E}$$

$$\nabla \times \vec{E} = i\mu\omega \vec{H}$$

$$\nabla \cdot \vec{E} = 0$$

$$\nabla \cdot \vec{B} = 0 \quad (5)$$

if the region within the coil is source-free. Defining $$k_1 = i\omega\left(\varepsilon + i\frac{\sigma}{\omega}\right) \quad (6)$$

$$k_2 = i\omega\mu$$

the two curl equations become $$\nabla \times \vec{H} = -k_1 \vec{E}$$

$$\nabla \times \vec{E} = k_2 \vec{H} \quad (7)$$

Taking the curl of the first equation and substituting from the second shows that $\vec{H}$ satisfies the vector wave equation $$\nabla^2 \vec{H} + k^2 \vec{H} = 0 \quad (8)$$

where the wavenumber k is found from $$k^2 = -k_1 k_2 = \frac{\omega^2}{c^2} \cdot \left(\varepsilon_r + i\frac{\sigma}{\omega\varepsilon_0}\right), \quad (9)$$

$\varepsilon_r = \varepsilon/\varepsilon_0$ is the relative permittivity (i.e., the dielectric constant), $\varepsilon_0$ is the permittivity of free space, and it is assumed that $\mu = \mu_0$, the permeability of free space (c is the speed of light in vacuum). Reversing the procedure shows that $\vec{E}$ satisfies the same wave equation.

Rather than attempting find the modes of the $\vec{E}$ and $\vec{H}$ vector fields directly, simpler scalar functions are constructed from which the fields can be derived. The so-called Debye potentials are solutions to the scalar wave equation $$\nabla^2 \Pi + k^2 \Pi = 0. \quad (10)$$

There are two linearly independent solutions, known as the electric wave potential, $^e\Pi$, and the magnetic wave potential, $^m\Pi$. They are the radial components of the Hertz vector functions, $^e\vec{\Pi}$ and $^m\vec{\Pi}$, respectively. The 'electric' and 'magnetic' labels indicate the sources of the potentials: $^e\vec{\Pi}$ (and the field derived from it) is generated by a distribution of electric dipole moments and the source for $^m\vec{\Pi}$ (and the field derived from it) is a distribution of magnetic dipole moments. The Hertz vector functions have previously been used to study MRI sensitivity and specific absorption rate as a function of $B_1^+$ frequency. Debye potentials have been used to calculate the fields, and power dissipated, inside a spherical object due to a circular RF transmit surface coil.

The magnetic field derived from the Debye electric wave potential can be written $$^e\vec{H} = -k_1 [\nabla \times (\vec{r}\,^e\Pi)] \quad (11)$$

$$= -k_1 [\nabla^e\Pi \times \vec{r}]$$

where $\vec{r}$ is the position vector from the origin to the point at which $^e\vec{H}$ is measured (the observation point). The second line of Eq. (11) shows that $^e\vec{H}$ is everywhere perpendicular to $\vec{r}$, hence $^e\Pi$ produces transverse-magnetic (TM) field modes. The corresponding electric field, $^e\vec{E}$, can be found using the first line in Eq. (7). Similarly, the electric field derived from the magnetic wave potential is $$^m\vec{E} = k_2[\nabla \times (\vec{r}\,^m\Pi)] \quad (12)$$

$$= k_2[\nabla^m\Pi \times \vec{r}]$$

The second line shows that $^m\vec{E}$ is everywhere perpendicular to $\vec{r}$, hence $^m\Pi$ produces transverse-electric (TE) field modes. The corresponding magnetic field, $^m\vec{H}$, is found via the second line of Eq. (7). Explicit expressions for the fields in spherical coordinates are given in Appendix A.

The scalar wave equation, Eq. (10), is separable in spherical coordinates, with solutions of the form $$r\Pi = r\sum_{p=0}^{\infty}\sum_{q=-p}^{p}\Pi_{pq} \qquad (13)$$

where $$r\Pi_{pq} = [\alpha_p\psi_p(kr) + \delta_p\chi_p(kr)]P_{pq}(\cos\theta)[a_q\cos(q\varphi) + b_q\sin(q\varphi)] \qquad (14)$$

Each term in the product describes the wave potential's dependence on one of the spherical coordinates, $(r,\theta,\varphi)$. In this expression $\alpha_p$, $\delta_p$, $a_p$, and $b_p$ are arbitrary constants and $P_{pq}(x)$ is the associated Legendre polynomial of order p and degree q. The radial functions, $\psi_p$ and $\chi_p$, are solutions of the radial part of Eq. (10):

$$\left(\frac{\partial^2}{\partial r^2} + k^2 - \frac{p(p+1)}{r^2}\right)rF(r) = 0 \qquad (15)$$

and are related to Bessel functions of the first and second kind by $$\psi_p(kr) = \sqrt{\frac{\pi kr}{2}} \cdot J_{p+1/2}(kr) \qquad (16)$$

$$\chi_p(kr) = -\sqrt{\frac{\pi kr}{2}} \cdot N_{p+1/2}(kr)$$

In a homogeneous, linear, isotropic medium every solution of Maxwell's equations corresponds to e and m wave potentials of the form in Eq. (14) for some choice of the constants. If the solution region includes the origin, then $\delta_p=0$ for all p, since $\chi_p(kr)$ diverges at $r=0$. As an example, the Debye potentials for a plane wave propagating in the z-direction (in a region including the origin) can be written as $$r\,^e\Pi_{p1} = \frac{\alpha_0}{k^2}\psi_p(kr)P_{p1}(\cos\theta)\left[\frac{i^{p-1}(2p+1)}{p(p+1)}\cos(\varphi)\right] \qquad (17)$$

$$r\,^m\Pi_{p1} = \frac{i\alpha_0}{kk^2}\psi_p(kr)P_{p1}(\cos\theta)\left[\frac{i^{p-1}(2p+1)}{p(p+1)}\sin(\varphi)\right]$$

where $\alpha_0$ determines the amplitude of the wave.

Let the volume of interest in the bore of an MRI system be divided into two regions. Region I is outside the sample (the body) and has material properties ($\epsilon$, $\mu$, and $\sigma$) that do not differ significantly from vacuum values. The value of k in this region is denoted $k^{(I)}$. The sample comprises region II. Assume for the moment that the sample is homogeneous, with wavenumber $k^{(II)}$, and is centered on the origin. The potentials within the sample can be written $$r\,^e\Pi_{pq}^{(w)} = \frac{^e\alpha_{pq}^{(w)}}{(k^{(II)})^2}\psi_p(k^{(II)}r)P_{pq}(\cos\theta)[^ea_{pq}^{(w)}\cos(q\varphi) + ^eb_{pq}^{(w)}\sin(q\varphi)] \qquad (18)$$

$$r\,^m\Pi_{pq}^{(w)} = \frac{i\,^m\alpha_{pq}^{(w)}}{k^{(II)}k_2^{(II)}}\psi_p(k^{(II)}r)P_{pq}(\cos\theta)[^ma_{pq}^{(w)}\cos(q\varphi) + ^mb_{pq}^{(w)}\sin(q\varphi)]$$

where the superscript (w) denotes the wave within the sample. The $\alpha_{pq}^{(w)}$ terms are scaling constants, chosen to give the $a_{pq}^{(w)}$ and $b_{pq}^{(w)}$ coefficients convenient orders of magnitude (see below).

Outside the sample, there are two waves: the incident wave, produced by an RF source, and the wave scattered (or diffracted) by the sample. The net exterior fields are the sum of the incident and scattered fields. The fields produced by the RF source must converge at the origin, so the incident wave potentials have the same form as those in Eq. (18):

$$r\,^e\Pi_{pq}^{(i)} = \frac{^e\alpha_{pq}^{(i)}}{(k^{(I)})^2}\psi_p(k^{(I)}r)P_{pq}(\cos\theta)[^ea_{pq}^{(i)}\cos(q\varphi) + ^eb_{pq}^{(i)}\sin(q\varphi)] \qquad (19)$$

$$r\,^m\Pi_{pq}^{(i)} = \frac{i\,^m\alpha_{pq}^{(i)}}{k^{(I)}k_2^{(I)}}\psi_p(k^{(I)}r)P_{pq}(\cos\theta)[^ma_{pq}^{(i)}\cos(q\varphi) + ^mb_{pq}^{(i)}\sin(q\varphi)]$$

where the superscript (i) denotes the incident wave. The scattered wave does not exist at the origin, but must approach zero for large distances from the origin, for general values of k. The appropriate combination of the $\psi_p(kr)$ and $\chi_p(kr)$ functions is:

$$\zeta_p(kr) \equiv \psi_p(kr) - i\chi_p(kr) \qquad (20)$$

In terms of these so-called Riccati-Bessel functions, the potentials for the scattered wave are $$r\,^e\Pi_{pq}^{(s)} = \frac{^e\alpha_{pq}^{(s)}}{(k^{(I)})^2}\zeta_p(k^{(I)}r)P_{pq}(\cos\theta)[^ea_{pq}^{(s)}\cos(q\varphi) + ^eb_{pq}^{(s)}\sin(q\varphi)] \qquad (21)$$

$$r\,^m\Pi_{pq}^{(s)} = \frac{i\,^m\alpha_{pq}^{(s)}}{k^{(I)}k_2^{(I)}}\zeta_p(k^{(I)}r)P_{pq}(\cos\theta)[^ma_{pq}^{(s)}\cos(q\varphi) + ^mb_{pq}^{(s)}\sin(q\varphi)]$$

The fields corresponding to the Debye potentials within the sample and in the incident and scattered waves are derived in Appendix B. A complication of using these expressions is that $\psi_p(kr)$ and $\chi_p(kr)$ have vastly different orders of magnitude for p>kr. Hence, the $\alpha_{pq}$ constants are used to set a convenient common scale for the wave potentials (Appendix C).

Figure 4:
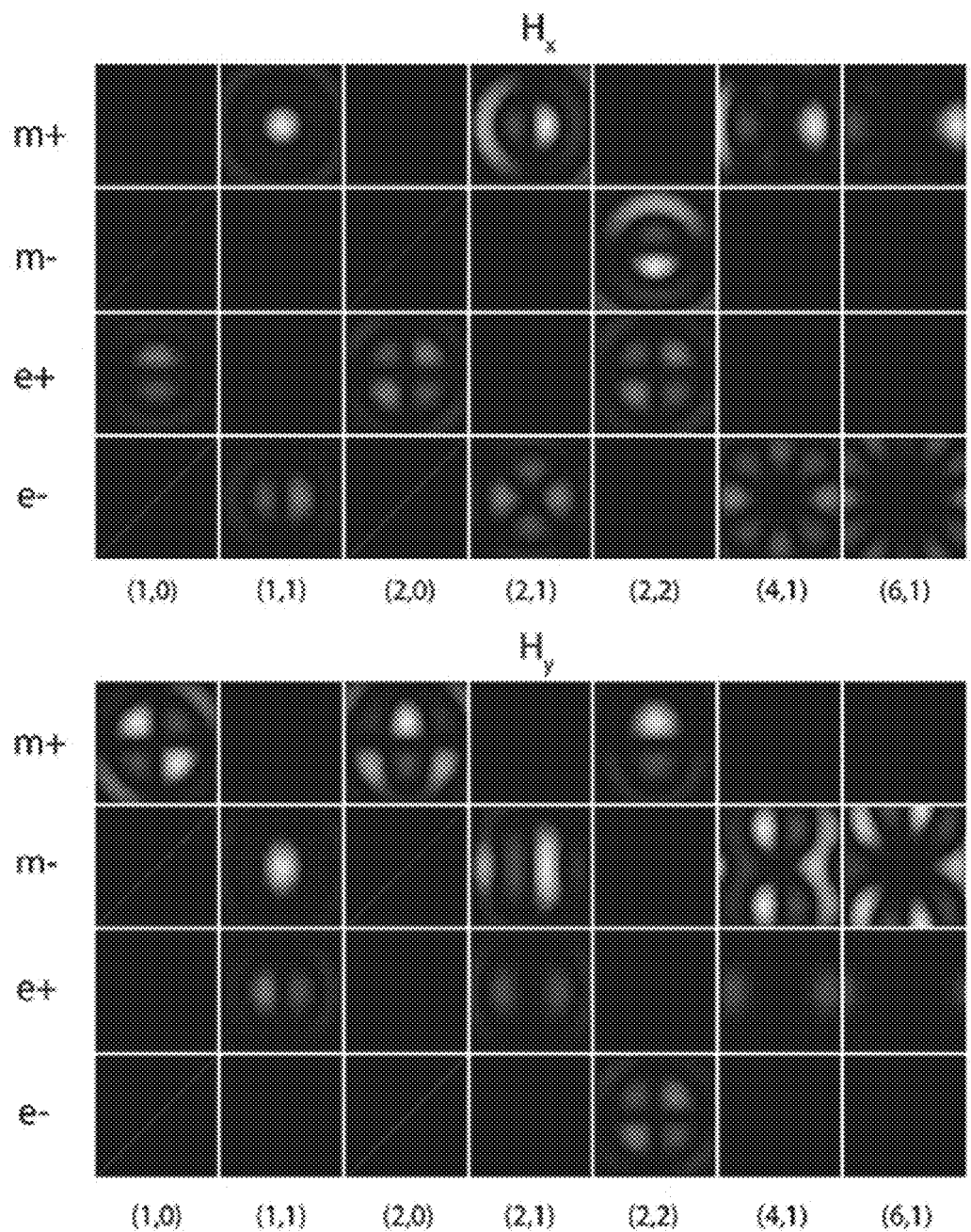
FIG. 4 illustrates transverse magnetic fields corresponding to selected modes. $H_x$ (top panel) and $H_y$ (bottom panel) are displayed in the x=0 plane (y increases down columns and z increases to the right). Phase of the field is indicated by gray scale intensity (different shades of gray represent 0°, 90°, 180°, and 270° phase). Modes are designated by (order, degree), source ('m' or 'e'-mode) and parity ('+' for potentials even in y, '−' for odd in y). Modes that are identically zero ('−' parity modes for q=0) are marked with a diagonal slash. Note that the modes contributing to $H_x$ and $H_y$ are complementary.

The Debye potentials provide a simple parameterization of the fields in each of the three waves (incident, within the sample, and scattered). Any wave that satisfies Maxwell's equations can be concisely described by the coefficients $^ea_{pq}$, $^eb_{pq}$, $^ma_{pq}$, and $^mb_{pq}$ for each order (p) and degree (q). Each term in the pair of Debye potentials describes one mode of the corresponding wave—the coefficients give the amplitudes of the modes that comprise the wave. The transverse magnetic fields corresponding to several modes are plotted in FIG. 4.

2.2 Relations Between the Incident, Scattered, and Internal Waves

For the case of a homogeneous object, it is straightforward to calculate the relationship between incident, scattered, and internal waves. The coefficients for waves inside and outside the object are related by the appropriate boundary conditions. Assuming negligible surface current density, conservation of energy requires the fields tangential to the sample surface to be continuous across the boundary at every point on the surface:

$$\vec{H}_\parallel^{(i)} + \vec{H}_\parallel^{(s)} = \vec{H}_\parallel^{(w)}$$

$$\vec{E}_\parallel^{(i)} + \vec{E}_\parallel^{(s)} = \vec{E}_\parallel^{(w)} \qquad (22)$$

where the subscript '∥' denotes the part of the vector that is tangential to the surface. At each surface point, Eq. (22) represents four constraints on the fields (two for each field, since the space tangent to the surface at each point is two dimensional). If n̂ is the (outward) unit normal vector to the surface, then Eq. (22) can be expressed as $$\hat{n} \times (\vec{H}^{(i)} + \vec{H}^{(s)}) = \hat{n} \times \vec{H}^{(w)}$$

$$\hat{n} \times (\vec{E}^{(i)} + \vec{E}^{(s)}) = \hat{n} \times \vec{E}^{(w)} \quad (23)$$

For a spherical sample, the constraints are particularly simple in spherical coordinates because the tangential fields have no radial component. For samples with more general shapes, however, there is no strong advantage to spherical coordinates, so one can rewrite Eq. (23) in Cartesian coordinates:

$$n_y(H_z^{(i)}+H_z^{(s)})-n_z(H_y^{(i)}+H_y^{(s)})=n_yH_z^{(w)}-n_zH_y^{(w)}$$

$$n_z(H_x^{(i)}+H_x^{(s)})-n_x(H_z^{(i)}+H_z^{(s)})=n_zH_x^{(w)}-n_xH_z^{(w)}$$

$$n_x(H_y^{(i)}+H_y^{(s)})-n_y(H_x^{(i)}+H_x^{(s)})=n_xH_y^{(w)}-n_yH_x^{(w)}$$

$$n_y(E_z^{(i)}+E_z^{(s)})-n_z(E_y^{(i)}+E_y^{(s)})=n_yE_z^{(w)}-n_zE_y^{(w)}$$

$$n_z(E_x^{(i)}+E_x^{(s)})-n_x(E_z^{(i)}+E_z^{(s)})=n_zE_x^{(w)}-n_xE_z^{(w)}$$

$$n_x(E_y^{(i)}+E_y^{(s)})-n_y(E_x^{(i)}+E_x^{(s)})=n_xE_y^{(w)}-n_yE_x^{(w)} \quad (24)$$

Note that although there are six equations, they represent only four independent constraints. Suppose these relations are enforced at $N_s$ surface points. The total number of constraints is then $4N_s$. Expressing the fields in terms of the Debye potential coefficients (Appendix B), there are 2(2p+1) coefficients for order p for each wave (incident, scattered, and within the sample). Truncating the Debye potential series at $p=p_{max}$, there are a total of $N_m=2p_{max}(p_{max}+2)$ coefficients per wave (and hence $N_m$ modes per wave). If the coefficients are known for the incident wave, then the wave within the sample and scattered wave are defined by $N_u=2N_m$ unknown coefficients. Simultaneously solving Eq. (24) at $N_s$ points, distributed approximately evenly across the sample surface, determines the unknown coefficients provided $$N_s \geq p_{max}(p_{max}+2) \quad (25)$$

This approach of matching the boundary conditions at many distributed surface points to determine the internal and scattered fields is known as the Point Matching Method (PMM) and has been used extensively to study Mie scattering from nonspherical objects. In most applications, the scattered wave is of primary interest, since it contains information on the size, shape and composition of the scattering object. In the various embodiments, however, the wave of interest is within the sample, where it will interact with spins to produce an MR signal. Specifically, each mode of the incident wave excites (in general) multiple modes within the sample. If the correspondence between incident and internal modes is known, then the incident wave can be chosen to construct a desired target field within the sample. In the current example, the goal is to produce a traveling plane wave, with Debye potentials defined by Eq. (17), within the sample. For this application, the technique is named Traveling Internal Plane-wave Synthesis (TIPS).

One begins by determining the unknown wave coefficients in terms of the incident wave coefficients. The surface points are labeled with index $i=1, 2, \ldots, N_s$. The unknown coefficients are labeled with the index $j=1, 2, \ldots, N_u$ in what will be called the standard order: p increases from 1 to $p_{max}$ and for each value of p, the degree q increases from 0 to p. For each (p,q) combination, the coefficients appear in the following order:

$$\{{}^ea_{pq}^{(w)}, {}^eb_{pq}^{(w)}, {}^ma_{pq}^{(w)}, {}^mb_{pq}^{(w)}, {}^ea_{pq}^{(s)}, {}^eb_{pq}^{(s)}, {}^ma_{pq}^{(s)}, {}^mb_{pq}^{(s)}\} \quad (26)$$

except when q=0, in which case the odd parity terms are identically zero, so only the ${}^ea_{pq}^{(\cdot)}$ and ${}^ma_{pq}^{(\cdot)}$ terms are needed (the dot stands for any wave index, w, s, or i), $$\{{}^ea_{pq}^{(w)}, {}^ma_{pq}^{(w)}, {}^ea_{pq}^{(s)}, {}^ma_{pq}^{(s)}\} \quad (q=0) \quad (27)$$

The values of the unknown coefficients are the elements of a column vector, $\vec{\beta}$, in the $N_u$-dimensional space of possible internal and scattered waves (to order $p_{max}$).

Consider the first line of Eq. (24), which expresses the fact that the x component of $\hat{n} \times \vec{H}$ is continuous across the surface of the sample. It can be rewritten as $$n_y H_z^{(w)} - n_z H_y^{(w)} - n_y H_z^{(s)} + n_z H_y^{(s)} = n_y H_z^{(i)} - n_z H_y^{(i)} \quad (28)$$

Substituting the expressions for the field components from Appendix B, Eqs. (B22) and (B24), this becomes $$\sum_{p=1}^{\infty} \sum_{q=0}^{p} \{{}^ea_{pq}^{(w)} \cdot [n_y \, {}^{e+}h_{zpq}^{(w)} - n_z \, {}^{e+}h_{ypq}^{(w)}] + {}^eb_{pq}^{(w)} \cdot \\ [n_y \, {}^{e-}h_{zpq}^{(w)} - n_z \, {}^{e-}h_{ypq}^{(w)}] + {}^ma_{pq}^{(w)} \cdot [n_y \, {}^{m+}h_{zpq}^{(w)} - n_z \, {}^{m+}h_{ypq}^{(w)}] + \\ {}^mb_{pq}^{(w)} \cdot [n_y \, {}^{m-}h_{zpq}^{(w)} - n_z \, {}^{e-}h_{ypq}^{(w)}] - \\ {}^ea_{pq}^{(s)} \cdot [n_y \, {}^{e+}h_{zpq}^{(s)} - n_z \, {}^{e+}h_{ypq}^{(s)}] - {}^eb_{pq}^{(s)} \cdot [n_y \, {}^{e-}h_{zpq}^{(s)} - \\ n_z \, {}^{e-}h_{ypq}^{(s)}] - {}^ma_{pq}^{(s)} \cdot [n_y \, {}^{m+}h_{zpq}^{(s)} - n_z \, {}^{m+}h_{ypq}^{(s)}] - \\ {}^mb_{pq}^{(s)} \cdot [n_y \, {}^{m-}h_{zpq}^{(s)} - n_z \, {}^{e-}h_{ypq}^{(s)}]\} = n_y H_z^{(i)} - n_z H_y^{(i)} \quad (29)$$

This relation must be satisfied at all $N_s$ points selected on the surface. It can be written as a matrix equation as follows. First, the right hand side is evaluated for a single incident wave mode (e.g., ${}^ma_{21}^{(i)}=1$ and all other incident coefficients are zero) at all surface points. The $N_s$ values form the elements of an $N_s \times 1$ column vector, $\vec{v}_1^{(i)}$. The left hand side can be written as a product $\tilde{X}_1 \cdot \vec{\beta}$ where $\tilde{X}_1$ is an $N_s \times N_u$ matrix, each column of which is one of the terms in square brackets in Eq. (29) for some (p,q) pair of indices, evaluated at the $N_s$ surface points. Hence, Eq. (29) can be written as $$\tilde{X}_1 \cdot \vec{\beta} = \vec{v}_1^{(i)} \quad (30)$$

The second line of Eq. (24), for the y component of $\hat{n} \times \vec{H}$, can be handled in the same way, leading to the equation $$\tilde{X}_2 \cdot \vec{\beta} = \vec{v}_2^{(i)} \quad (31)$$

The remaining boundary conditions give analogous equations. These can be combined in a single matrix equation $$\tilde{X} \cdot \vec{\beta} = \vec{v}^{(i)} \quad (32)$$

where $$\tilde{X} = \begin{pmatrix} \tilde{X}_1 \\ \tilde{X}_2 \\ \vdots \\ \tilde{X}_6 \end{pmatrix}; \vec{v}^{(i)} = \begin{pmatrix} \vec{v}_1^{(i)} \\ \vec{v}_2^{(i)} \\ \vdots \\ \vec{v}_6^{(i)} \end{pmatrix} \quad (33)$$

The interior and scattered wave coefficients can be found, in principle, by solving Eq. (32) in a least-squares sense, for example by using the Moore-Penrose pseudoinverse, $\tilde{X}^+$, of $\tilde{X}$:

$$\hat{\vec{\beta}} = \tilde{X}^+ \cdot \vec{v}^{(i)} \tag{34}$$

The elements of $\hat{\vec{\beta}}$ are least-squares estimates of the interior and scattered wave coefficients produced by the single incident mode described by $\vec{v}^{(i)}$. In practice, a weighted least squares solution gives somewhat better results, as discussed below.

Once the mapping is known from incident wave modes to internal modes, the second step is to find the superposition of incident modes that will produce the desired wave within the sample. To solve this problem, the incident modes are labeled with the index j as above, that is p goes from 0 to $p'_{max}$ and for every p value, q goes from 0 to p. For each (p,q) pair, the order of the coefficients is $$\{^e a_{pq}^{(i)}, ^e b_{pq}^{(i)}, ^m a_{pq}^{(i)}, ^m b_{pq}^{(i)}\} \tag{35}$$

although the $b_{pq}^{(i)}$ are dropped for q=0. Hence, the index j runs from 1 to $N_i = 2p'_{max}(p'_{max}+2)$. Note that $p'_{max}$ is not necessarily equal to the $p_{max}$ used to construct the left hand side of Eq. (32).

The solution of Eq. (34) for the incident mode with index j gives the corresponding scattered and internal wave coefficients. Only the internal coefficients are relevant, so one can extract those from $\hat{\vec{\beta}}$ and put them (in standard order) in the $N_m \times 1$ column vector $\vec{\beta}_j^{(w)}$. Repeating for all values of j, one can construct the $N_m \times N_i$ coupling matrix:

$$\tilde{C} = (\vec{\beta}_1^{(w)} \vec{\beta}_2^{(w)} \ldots \vec{\beta}_{N_i}^{(w)}) \tag{36}$$

Each column gives the coefficients of the internal wave corresponding to unit amplitude of an incident field mode. The coupling matrix is an example of a transition or T-matrix approach that was originally used to relate scattered to incident modes, but here it is applied to the internal field. Let the coefficients (in standard order) of a general incident wave be the elements of the $N_i \times 1$ column vector $\vec{u}^{(i)}$. Suppose the coefficients (also in standard order) of the desired wave within the sample are the elements of the $N_m \times 1$ column vector $\vec{d}^{(w)}$. The goal is to find the value of $\vec{u}^{(i)}$ that satisfies $$\tilde{C} \cdot \vec{u}^{(i)} = \vec{d}^{(w)} \tag{37}$$

If the elements of $\vec{d}^{(w)}$ yield the coefficients in Eq. (17), then $\vec{u}^{(i)}$ specifies the incident field that produces a plane-wave (to order $p_{max}$) within the sample.

3. Production of Target RF Fields

An obvious application of the TIPS approach is brain imaging. However, there are several limitations of the basic theory in practical cases. Even if one makes the approximation that the electromagnetic properties of the brain are homogeneous and isotropic, the brain is enclosed by the skull and layers of extracranial tissue, which have different material properties. One approach to dealing with this is to construct a detailed model of the head and use the boundary conditions, Eq. (24), at each interface to relate the incident wave to modes within the brain. This would add considerable complexity to the technique and would likely be prone to errors when applied to individual subjects in routine imaging. An alternative is simply to postulate a linear relationship between incident and within-brain modes. Measuring the modes within the brain generated by each incident mode then provides the necessary information for traveling wave synthesis within the brain.

3.1 Calculation of Incident Mode Amplitudes

As described in the introduction to Section 2, the field mapping matrix $\tilde{H}_m$ holds the internal $H_x$ and $H_y$ values produced by each incident mode (values for mode j are in the $j^{th}$ column of the matrix). The transverse field values corresponding to each mode of the internal field can be calculated directly from Eqs. (B20)-(B23) in Appendix B. Suppose these values are used to construct the $(2N_V) \times N_m$ matrix, $\tilde{H}_\perp$, of transverse field values for the $N_m$ internal field modes (through order $p_{max}$). The order of elements is the same as for the mapping matrix: column j of $\tilde{H}_\perp$ gives the (theoretical) values of $H_x$ and $H_y$ for the $j^{th}$ mode of the wave within the sample. The uniqueness of the correspondence between internal modes and the $H_x$ and $H_y$ values is discussed in Appendix D.

If $\tilde{C}$ describes the correspondence between incident modes and modes within the VOI, then $$\tilde{H}_m = \tilde{H}_\perp \cdot \tilde{C} \tag{38}$$

because both sides of the equality give the transverse field values produced by unit amplitude of each incident field mode (the values for mode j in the $j^{th}$ column of the matrix on the left and of the product of matrices on the right). The matrix $\tilde{C}$ describes the net effect of all intervening layers of tissue. The existence of $\tilde{C}$ only relies on an assumption of linearity of the fields (i.e., that the interior field excited by two incident modes is the sum of the fields produced by each of the two incident modes in isolation).

Multiplying both sides of Eq. (37) from the left by $\tilde{H}_\perp$, one finds $$\tilde{H}_m \cdot \vec{u}^{(i)} = \tilde{H}_\perp \cdot \vec{d}^{(w)} \tag{39}$$
$$= \vec{H}_t$$

which is the same as Eq. (1), where $\vec{H}_t$ specifies the target field. This shows that the achievable target fields are linear combinations of the columns of $\tilde{H}_\perp$ and an appropriate set of incident (transmitted) modes to produce the target field is defined by Eq. (19). A solution for $\vec{u}^{(i)}$ is guaranteed to exist if the column-rank of $\tilde{H}_m$ is $\geq 2N_V$.

3.2 Coil Design for TIPS

The TIPS method relies on the ability to excite modes of the incident field independently, both for the mapping measurements just described and for plane wave synthesis. A simple approach is to find current distributions that produce each mode of the Debye potentials up to some maximum order, $p_{max}$. The radial magnetic field component of order p and degree q is proportional to the m mode Debye potential, so exciting a single mode of the potential reduces to the problem of generating a specific angular dependence of $H_r$. According to Eq. (B2), $$H_{rpq} = \left(\frac{p(p+1)}{r^2}\right) r^m \Pi_{pq} \tag{40}$$

A current distribution that produces $H_r(\theta,\varphi) \propto P_{pq}(\cos\theta)\cos(q\varphi)$ or $P_{pq}(\cos\theta)\sin(q\varphi)$ on the surface of a sphere (centered on the origin) will excite only the (p,q,+) or (p,q,−) mode, respectively, of the incident wave.

Figure 5:
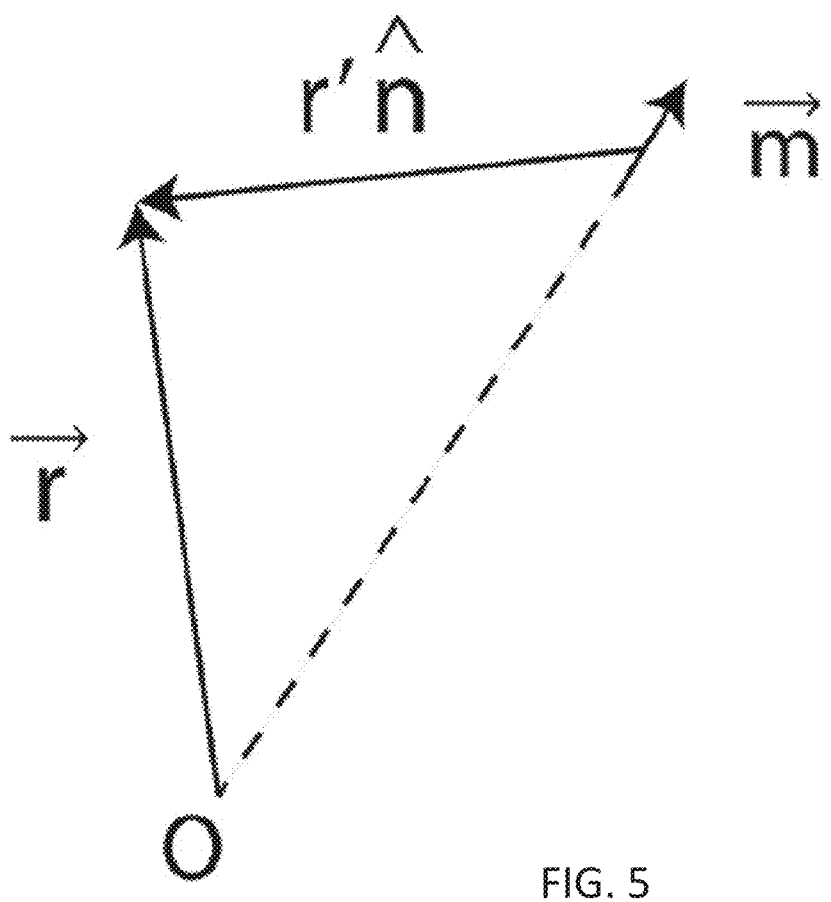
FIG. 5 illustrate the geometric relation between a radially oriented dipole, $\vec{m}$, and a field observation point at position $\vec{r}$ relative to the origin (at O). The position of the observation point relative to the dipole is defined as r'n̂. The vectors $\vec{m}$, $\vec{r}$, and n̂ lie in a plane, so $\vec{r} \cdot (\vec{m} \times \hat{n})=0$.

One straightforward approach is to use an array of magnetic dipoles. The fields due to an oscillating magnetic dipole, $\vec{m} e^{-i\omega t}$, are $$\vec{H} = \frac{1}{4\pi}\left\{k^2(\hat{n}\times\vec{m})\times\hat{n}\frac{e^{ikr'}}{r'} + [3\hat{n}(\hat{n}\cdot\vec{m})-\vec{m}]\left(\frac{1}{r'^3} - \frac{ik}{r'^2}\right)e^{ikr'}\right\} \quad (41)$$

$$\vec{E} = -\frac{1}{4\pi}\sqrt{\frac{\mu_0}{\varepsilon_0}}\, k^2(\hat{n}\times\vec{m})\frac{e^{ikr'}}{r'}\left(1 - \frac{1}{ikr'}\right)$$

at an observation point displaced from the dipole by $\hat{n}r'$. Suppose the dipole is at distance R from the origin and is radially oriented, so $\vec{m}$ points away from (or toward) the origin. If the observation point is at position $\vec{r}$ relative to the origin, then $\vec{r}$ is in the plane defined by $\vec{m}$ and $\hat{n}$ (since these vectors lie along the sides of the triangle formed by vertices at the origin, the dipole, and the observation point—see FIG. 5). Hence $\vec{r} \cdot (\hat{n}\times\vec{m})=0$ for a radial dipole, which implies that $E_r=\hat{r}\cdot\vec{E}=0$, so a radial magnetic dipole produces a transverse electric (m mode) field. An array of radial magnetic dipoles distributed over a surface, with suitable amplitudes to produce a single $^m\Pi_{pq}$ mode in Eq. (40), does not affect the $E_r$ field component. Such an array of radial magnetic dipoles will be called an m-coil.

The fields due to an electric dipole $\vec{p} e^{-i\omega t}$ are similar to Eq. (41), with the roles reversed between $\vec{H}$ and $\vec{E}$:

$$\vec{H} = \frac{ck^2}{4\pi}(\hat{n}\times\vec{p})\frac{e^{ikr'}}{r'}\left(1 - \frac{1}{ikr'}\right) \quad (42)$$

$$\vec{E} = \frac{1}{4\pi\varepsilon_0}\left\{k^2(\hat{n}\times\vec{p})\times\hat{n}\frac{e^{ikr'}}{r'} + [3\hat{n}(\hat{n}\cdot\vec{p})-\vec{p}]\left(\frac{1}{r'^3} - \frac{ik}{r'^2}\right)e^{ikr'}\right\}$$

If the electric dipole is radially oriented, then $\vec{r} \cdot (\hat{n}\times\vec{p})=0$ at the observation point, $\vec{r}$. Hence, the radial component of the magnetic field $H_r=0$; radial electric dipoles excite only transverse magnetic (e mode) fields. From Eq. (B13), the (p,q) modes of the radial electric field are proportional to the corresponding Debye potential terms:

$$E_{rpq} = \left(\frac{p(p+1)}{r^2}\right)r\, ^e\Pi_{pq} \quad (43)$$

Hence, if an array of radial electric dipoles creates a field with angular dependence $E_r(\theta,\varphi) \propto P_{pq}(\cos\theta)\cos(q\varphi)$ or $P_{pq}(\cos\theta)\sin(q\varphi)$ on the surface of a sphere (centered on the origin), then it excites a single e mode, independent of the m modes. The array of radial electric dipoles will be termed an e-coil.

The modes of the m- and e-coils can be driven independently by adjusting the currents in small current loops (m modes) and short electric dipoles (e modes). The current distributions that produce a particular desired mode are described below.

4. Simulation and Testing of the TIPS Theory

The examples shown here are not intended to limit the various embodiments. Rather they are presented solely for illustrative purposes.

The general approach described above was implemented in a computer simulation to evaluate four specific cases for a dielectric, non-conducting object: 1) an external plane wave incident on a homogeneous spherical phantom, 2) an incident wave optimized to produce a traveling plane wave within the spherical phantom, 3) an external plane wave incident on a homogeneous ellipsoidal phantom, and 4) an incident wave optimized to produce a traveling plane wave within the ellipsoidal phantom. A plane wave was chosen to model an incident traveling wave, both for simplicity and to highlight the differences between external and internal plane waves. For cases 2 and 4, the dipole amplitudes that produce the desired field were calculated. In each case, the material properties of the simulated phantom were set to $\varepsilon_r=80$, $\mu=\mu_0$, and $\sigma=0$. The diameter of the spherical phantom was 14 cm. The ellipsoidal phantom had principal axes of length 14, 16, and 12 cm, chosen to approximate the dimensions of an adult brain (x, y, and z dimensions, respectively, prior to rotation). The ellipsoid was rotated to simulate arbitrarily chosen chin-to-chest and left-to-right tilt in the scanner (Euler rotation angles 90° around the z axis, followed by 20° degrees around the intermediate y' axis, then −80° around the final z" axis). In each case, the phantom was centered on the origin (magnet isocenter). Two additional cases were simulated to evaluate the effects of conductive media. In these, the conductivity was set to 0.5 S/m, but the other parameters were the same as above. The first case simulates the internal plane wave in the conductive object (to compare to case 4, above). The second case shows the effects of two counter-propagating plane waves in the object. In all cases, the coordinates of the phantom's surface were identified at $N_s=1002$ points at orientations (approximately) uniformly distributed on the unit sphere. Unit normal vectors were calculated at each surface point.

4.1 Coupling Matrix Calculation

The within-sample electromagnetic field generated by each incident field mode (through $6^{th}$ order) was simulated as described in section 2.2. First, the design matrix, $\tilde{X}$, for the boundary condition equations (6 equations at each of 1002 surface points) was constructed. In the case of a sphere centered on the origin, incident modes couple only to the internal mode of the same order, degree, source, and parity, so the coupling matrix is expected to be diagonal. Hence, for the sphere, internal and scattered waves were calculated for orders up to and including the maximum incident order (p=6). For the ellipsoidal phantom, the symmetry no longer exists, so incident modes generally couple to several internal and scattered wave modes. Hence for the ellipsoidal phantom, the internal and scattered modes were calculated through order $p_{max}=20$. For each incident field mode, the internal and scattered mode amplitudes (the elements of $\vec{\beta}$) that satisfy the boundary conditions were found by solving Eq. (32). In SI units, the numerical value of the electric field amplitude is orders of magnitude larger than that of the magnetic field in a plane wave. Hence, the residuals in a standard least squares solution to Eq. (32) typically represent a small fractional error in the electric field and much larger fractional error in the magnetic field components. To split the residual errors evenly between electric and magnetic field components, the weighted least squares (WLS) solution to Eq. (32) can be calculated, where the weights are norms of the incident wave tangential electric and magnetic fields summed over the surface of the sample (this is equivalent to dividing the first three lines of Eq. (24) by the norm of the incident tangential magnetic field and the last three lines by the norm of the incident tangential electric field). The resulting $\vec{\beta}^{(w)}$ vectors were assembled into the coupling matrix, $\tilde{C}$, according to Eq. (36). Note that in practical cases, using boundary conditions to find $\tilde{C}$ is not feasible, so the coupling matrix is estimated from the field maps, as follows. The matrix of transverse field values, $\tilde{H}_\perp$, was calculated by evaluating Eqs. (B21) and B(23) on a cubic grid of sample points within the phantom (sample spacing=1 cm). The simulated field mapping matrix, $\hat{H}_m$, was calculated via Eq. (38)—note that in an actual experiment, $\hat{H}_m$ would be measured.

4.2 Incident Wave Specification

In each case, the incident wave is described by a set of (complex) amplitudes of the field modes through $6^{th}$ order. For the incident plane wave, the amplitudes are given in Eq. (17): these amplitudes (in standard order) comprise the column array $\vec{t}^{(i)}$, which specifies the traveling incident plane wave. For the TIPS incident wave, the coefficients are found by solving Eq. (39) using Eq. (38):

$$\hat{\vec{u}}^{(i)} = (\tilde{H}_\perp \cdot \tilde{C})^+ \tilde{H}_\perp \cdot \vec{d}^{(w)} \quad (44)$$

The amplitudes, $\vec{d}^{(w)}$, for the target plane wave inside the sample were again taken from Eq. (17). Note that it is not generally true that $(\tilde{H}_\perp \cdot \tilde{C})^+ = \tilde{C}^+ \cdot \tilde{H}_\perp^+$, since the coupling matrix does not have full row rank for nonspherical samples. As an alternative to Eq. (44), the relation in Eq. (37) could be inverted directly. However, this was found to give somewhat lower accuracy—multiplying both sides of Eq. (37) by $\tilde{H}_\perp$ (i.e., projecting the mode amplitudes into the space of measurable transverse fields), as in Eq. (39), before inversion produces lower residuals. To reiterate, Eq. (44) gives the solution to the inverse problem 'what combination of incident wave modes produces an internal plane wave?'.

4.3 Magnetic Field Simulations

The internal wave corresponding to the specified incident wave was found by enforcing the boundary conditions, as expressed by the coupling matrix. If the column array $\vec{g}^{(w)}$ holds the amplitudes of the internal modes (in standard order), then $$\vec{g}^{(w)} = \tilde{C} \cdot \vec{t}^{(i)} \text{ for plane wave excitation}$$

$$\vec{g}^{(w)} = \tilde{C} \cdot \hat{\vec{u}}^{(i)} \text{ for TIPS excitation} \quad (45)$$

In each case, the elements of $\vec{g}^{(w)}$ were used as the $\{^e a^{(w)}, ^e b^{(w)}, ^m a^{(w)}, ^m b^{(w)}\}$ coefficients to construct the internal transverse magnetic field, using Eqs. (B20) and (B22).

The amplitudes of the scattered wave modes were extracted from the $\vec{\beta}$, the weighted least squares solutions to the boundary condition equations. The $\vec{t}^{(i)}$ or $\hat{\vec{u}}^{(i)}$ column array provided the amplitudes of the incident wave modes. Again, Eqs. (B20) and (B22) were used to evaluate the transverse magnetic fields, in this case external to the sample. In all cases, the fields were evaluated in a simulated imaging volume with 256 mm field of view (FOV) and resolution=128 in each dimension (i.e., 2 mm isotropic voxels). The coefficient of variation of $|H_y|$ was calculated over all voxels within the sample.

4.4 Proof of Principle RF Coil Design

To generate the desired field modes, radial dipoles can be distributed over the surface of a coil former. The coil dimensions used in this study were not optimized to accommodate any particular group of subjects and are intended only to illustrate a general strategy rather than a specific practical design. The coil former is composed of four parts, each of which is axially symmetric around the z axis (see FIG. 14). For simplicity, the direction of propagation of the plane wave is chosen to be $+\hat{z}$, so the z axis is chosen so z values increase going from head to foot, along the bore of the magnet. In order of increasing z, the first part of the coil is a hemisphere (at radius 12.5 cm from the origin), ending in the z=0 plane. The next is a cylindrical surface (25 cm diameter) that runs from z=0 to z=10 cm. The third is a spherical surface (at radius 16 cm from the origin) that joins the 25 cm cylinder to a narrower cylinder (16 cm in diameter, the fourth part), which provides an aperture for the neck and ends 20 cm from the origin. (In a practical coil, this would be constructed using a clam shell design to allow the coil to enclose the head.) Dipoles are arrayed on the composite surface at polar angles $\theta=(n+1)\cdot 15°$ ($n=1, \ldots, 10$) and at the upper limit of the coil ($z=20$ cm). For each polar angle, dipoles are arranged at azimuthal angles $\phi=m\cdot 15°$ ($m=1, \ldots, 24$). Hence the total number of dipoles is $11*24=264$.

The first goal is to determine the set of dipole amplitudes and phases in this dense array that produces each field mode in Eq. (4) (48 field modes through order $p_{max}=6$). For each dipole location in the array, the value of $H_r$ was calculated on the surface of a 10 cm radius observation sphere, assuming unit dipole amplitude (and zero phase), using Eq. (41). The field values for the $n^{th}$ dipole were placed in the $n^{th}$ column of the matrix $\tilde{H}_r$. The $H_r$ values for the $l^{th}$ incident field mode, calculated using Eq. (4) and the $2^{nd}$ line of Eq. (19), were put in the column array $\vec{y}_l$. The set of (complex) dipole amplitudes that generate mode $l$ is given by the elements of $\vec{\eta}_l$, which is the solution to $$\tilde{H}_r \cdot \vec{\eta}_l = \vec{y}_l \quad (46)$$

$$\hat{\vec{\eta}}_l = \tilde{H}_r^+ \cdot \vec{y}_l \quad (47)$$

This procedure was repeated for all modes through $6^{th}$ order (i.e., $l=1, \ldots, 48$). The $\hat{\vec{\eta}}_l$ array was placed in the $l^{th}$ column of the 264×48 matrix $\tilde{A}_m$, which therefore specifies the complex amplitudes of the 264 magnetic dipoles that produce each of the 48 TE field modes. An analogous procedure was used to calculate the matrix $\tilde{A}_e$ which specifies the complex amplitudes of the 264 electric dipoles that create each of the 48 TM field modes.

Finally, if $\vec{u}^{(i)}$ specifies the (complex) amplitudes of the desired incident wave modes, then the required magnetic dipole amplitudes are the elements of $$\vec{a}_m = \tilde{A}_m \cdot \vec{u}^{(i)} \quad (48)$$

while the electric dipole amplitudes are given by $$\vec{a}_e = \tilde{A}_e \cdot \vec{u}^{(i)} \quad (49)$$

Note that while the number of dipoles is large (i.e., 264 magnetic and 264 electric dipoles), the number of independent modes and therefore transmit channels is smaller (48 TE and 48 TM modes=96 transmit channels).

5. Results

Results are given first for dielectric (non-conducting) samples, then for the conducting ellipsoid. Finally, the arrays of radial dipoles that produce the TIPS fields are presented.

5.1 Dielectric Samples

Figure 6:
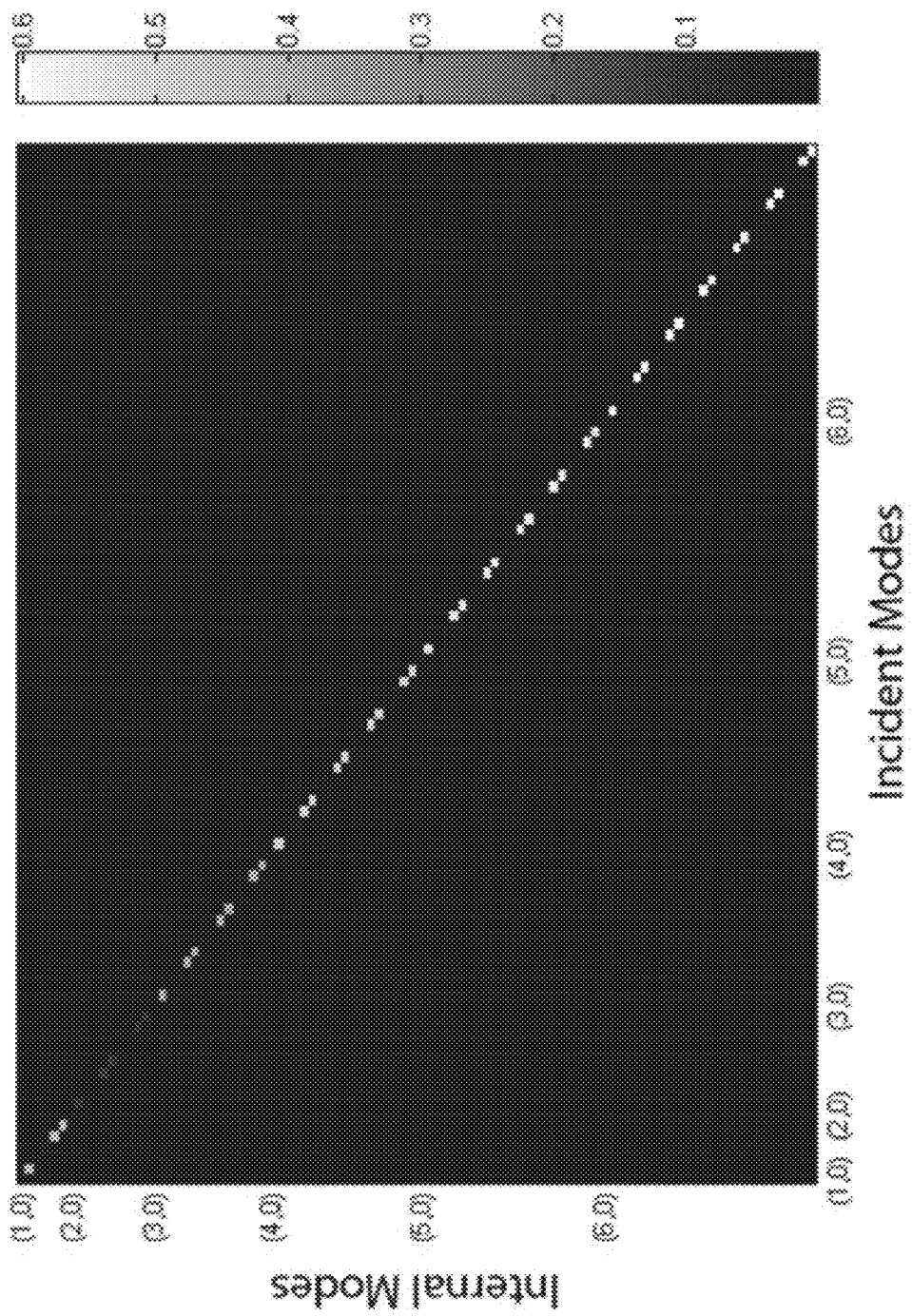
FIG. 6 shows a coupling matrix for the spherical dielectric phantom. The magnitude of the coupling matrix elements are shown for the lowest 6 orders of incident modes. Both incident and internal modes are arranged in standard order. Note that the coupling is diagonal for a spherical phantom centered on the origin.
Figure 7A:
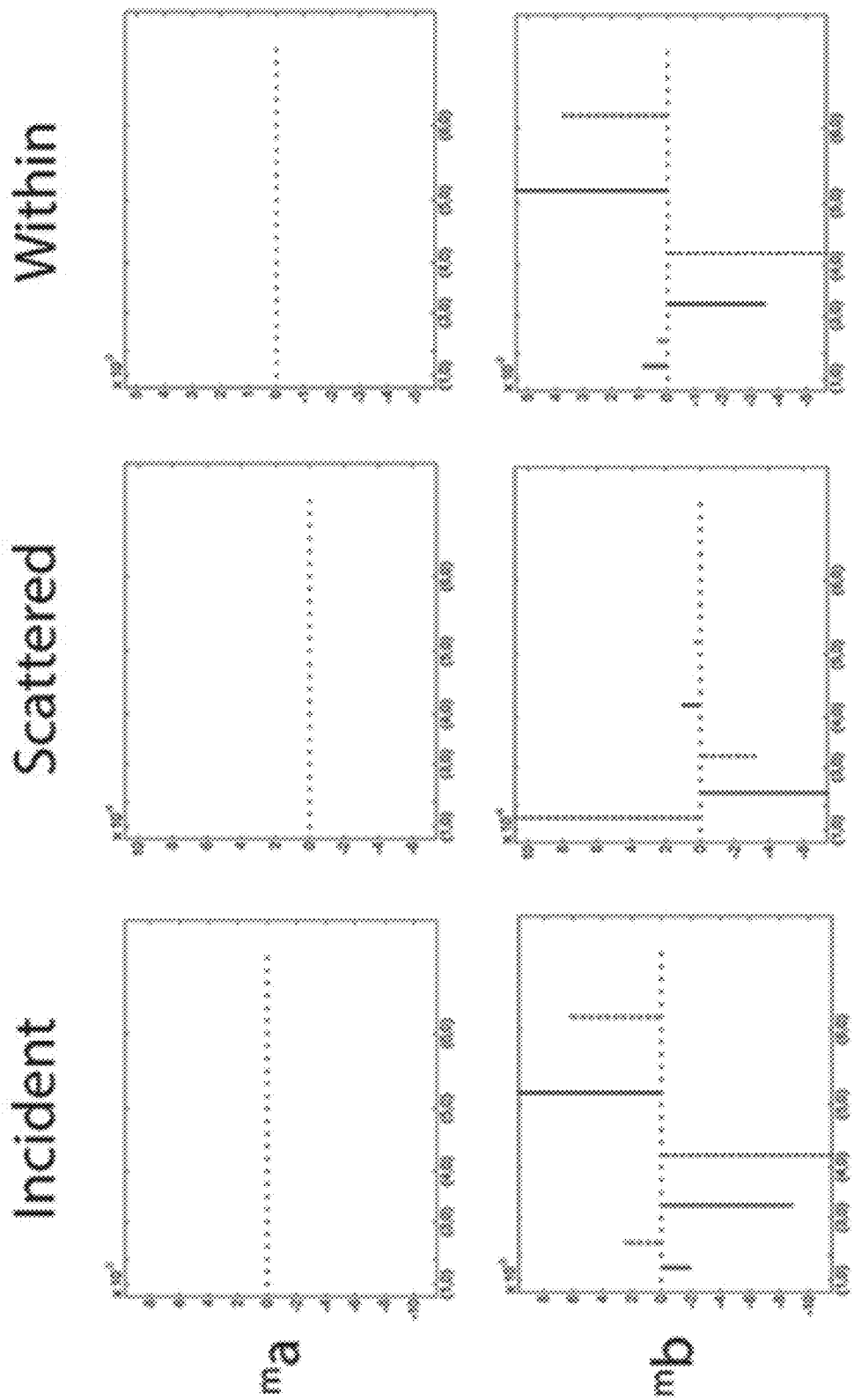
FIGS. 7A and 7B illustrates mode amplitudes for plane wave generation in the spherical dielectric phantom.
Figure 7B:
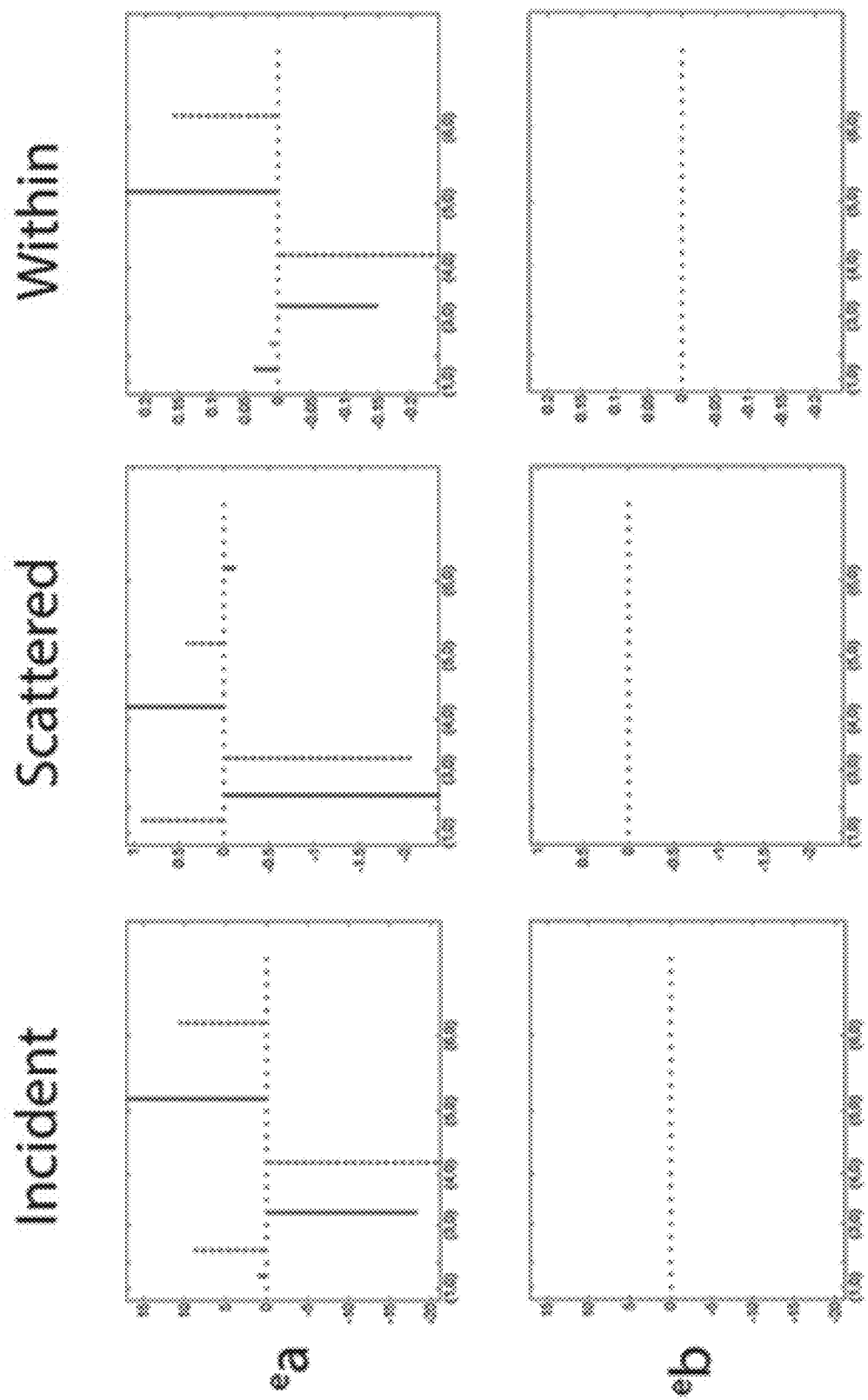
Figure 8A:
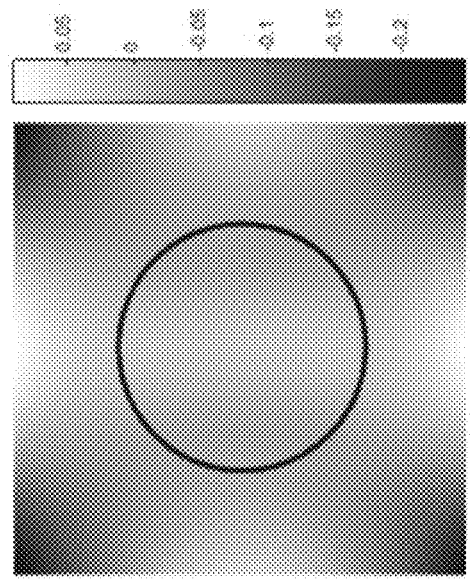
FIGS. 8A-8D shows $H_y$ for the spherical dielectric phantom for an incident plane wave (FIGS. 8A and 8C) and the optimized incident wave (FIGS. 8B and 8D). The magnetic field is shown in the x=0 plane at time t=0 for the incident plane wave (FIG. 8A) and optimized wave (FIG. 8B). The magnitude of $H_y$ inside the phantom is shown for the incident plane wave (FIG. 8C) and optimized wave (FIG. 8D). In both cases, the plane wave (either incident or internal) propagates to the right. Note the nearly uniform internal wavefront in (FIG. 8B) and |Hy| in (FIG. 8D). The units are A/m.
Figure 8B:
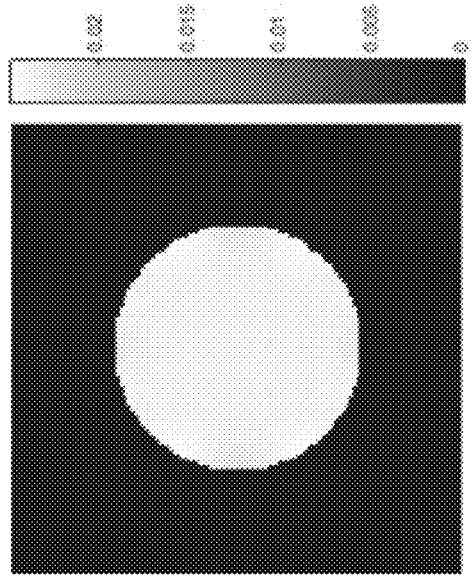
Figure 8C:
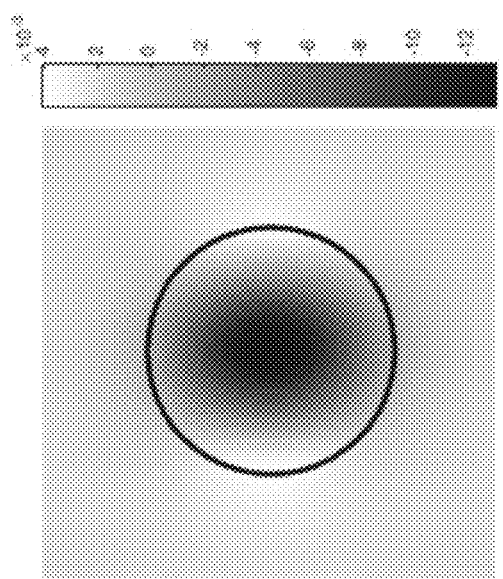
Figure 8D:
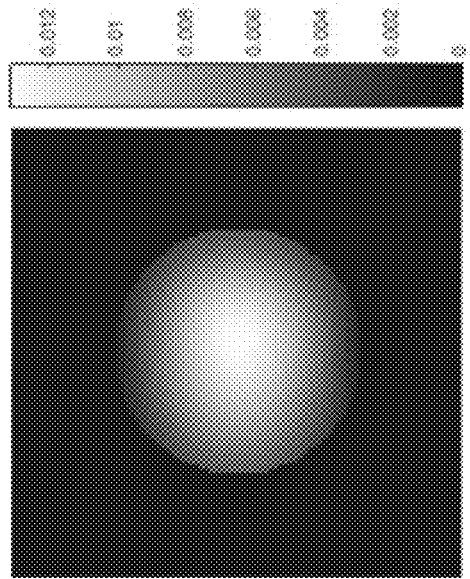

The magnitudes of the coupling matrix, $\tilde{C}$, elements are shown for the spherical dielectric phantom in FIG. 6. As expected, the matrix is diagonal. The coupling to some internal modes is stronger than others—incident mode power that is not transmitted into the sample goes into the scattered wave. The mode amplitudes that produce the best traveling internal plane wave (through $6^{th}$ order) are shown in FIGS. 7A and 7B. FIGS. 7A and 7B show amplitudes for the incident, scattered, and internal ('within') waves appear in the first, second, and third columns, respectively. The $^m a_{pq}$ amplitudes are plotted in standard order in the first row, followed by $^m b_{pq}$, $^e a_{pq}$, and $^e b_{pq}$ in the subsequent rows. For each amplitude, the real part is drawn with a solid line while the imaginary part is shown with a dashed line. Note that relatively few modes have significant amplitude. To facilitate comparisons, the pair of plots for each source ('m' or 'e') and wave have the same vertical scaling.

The ideal internal wave mode amplitudes are given in Eq. (17): the non-zero modes have q=1 and odd parity (for m-modes) or even parity (for e-modes). Only the corresponding incident and scattered modes are non-zero; their amplitudes are determined by the boundary conditions.

The y-component of magnetic field, $H_y$, for the spherical object is shown in FIG. 8 for both plane wave (left) and optimized incident wave (right) excitation. In the case of the incident plane wave, $H_y$ is strongly peaked near the center of the phantom: this is the well-known phenomenon of 'field focusing'. The coefficient of variation of $|H_y|$ (FIG. 8C) over the volume of the phantom is 53%, reflecting the wide variation of internal field strengths. For the optimized incident wave, the internal variations in $|H_y|$ (FIG. 8D) are much smaller: the coefficient of variation over the volume is 0.86%. Viewed over time, the crest of the internal $H_y$ wave (the bright stripe inside the phantom in FIG. 8B) moves to the right in the image. For the external field, the hot-spot on the left hand border of the image splits, the upper part circling clockwise, the lower part counterclockwise, until two cycles later they meet again at the right hand border of the image. Inside the phantom, the magnitude of the calculated x-component of the magnetic field is smaller than the y-component by more than 10 orders of magnitude. Hence, the optimized incident wave produces a nearly uniform-magnitude, linearly polarized magnetic field in the spherical object.

Figure 9A:
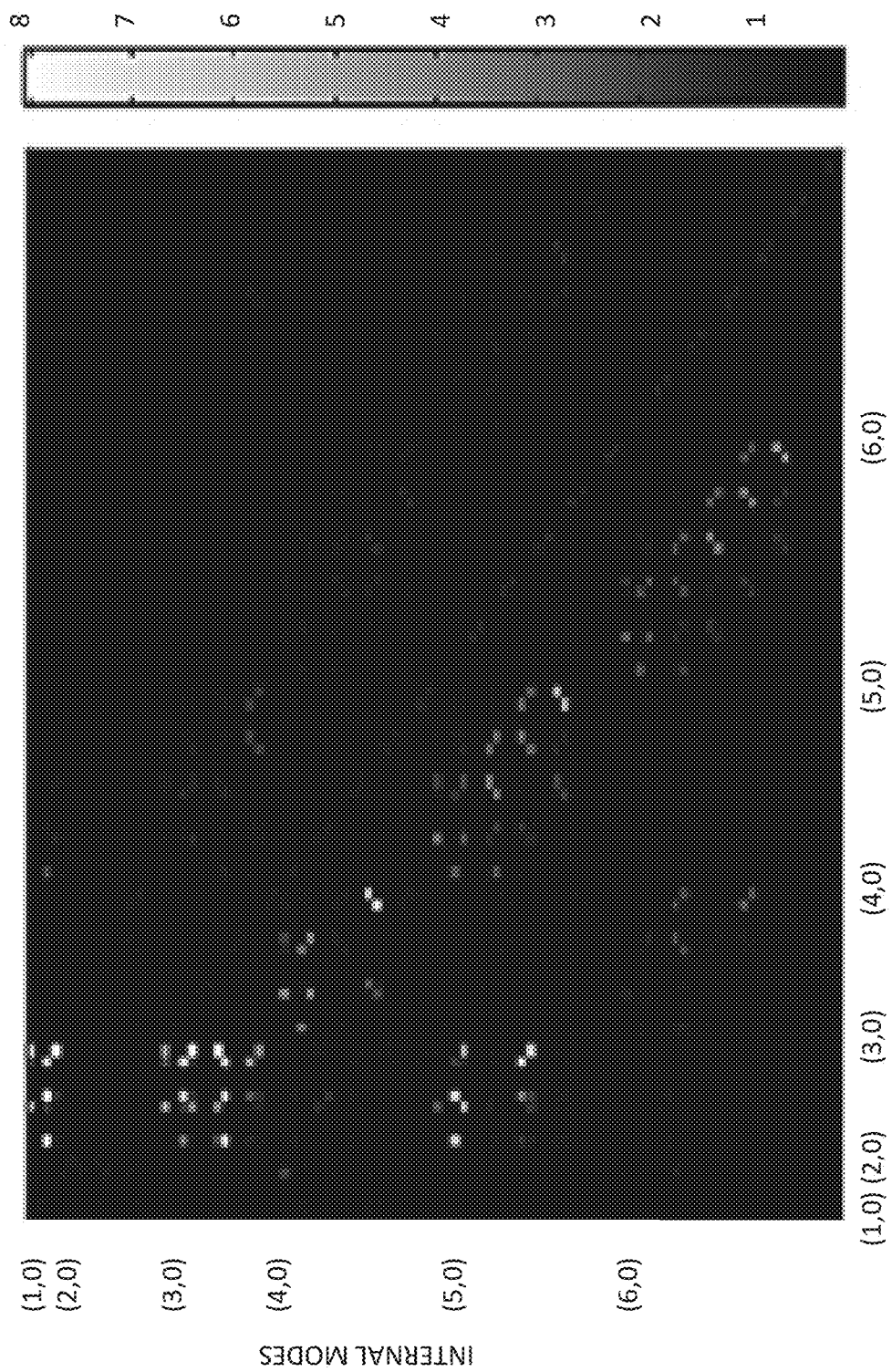
FIGS. 9A and 9B show a coupling matrix for the ellipsoidal dielectric phantom. Magnitude of the coupling matrix elements for the lowest 6 orders of internal modes (FIG. 9A) and for the lowest 20 orders (FIG. 9B). Both incident and internal modes are arranged in standard order. Note that the non-spherical phantom makes off-diagonal coupling coefficients large, spreading the incident energy over several orders of internal modes.
Figure 9B:
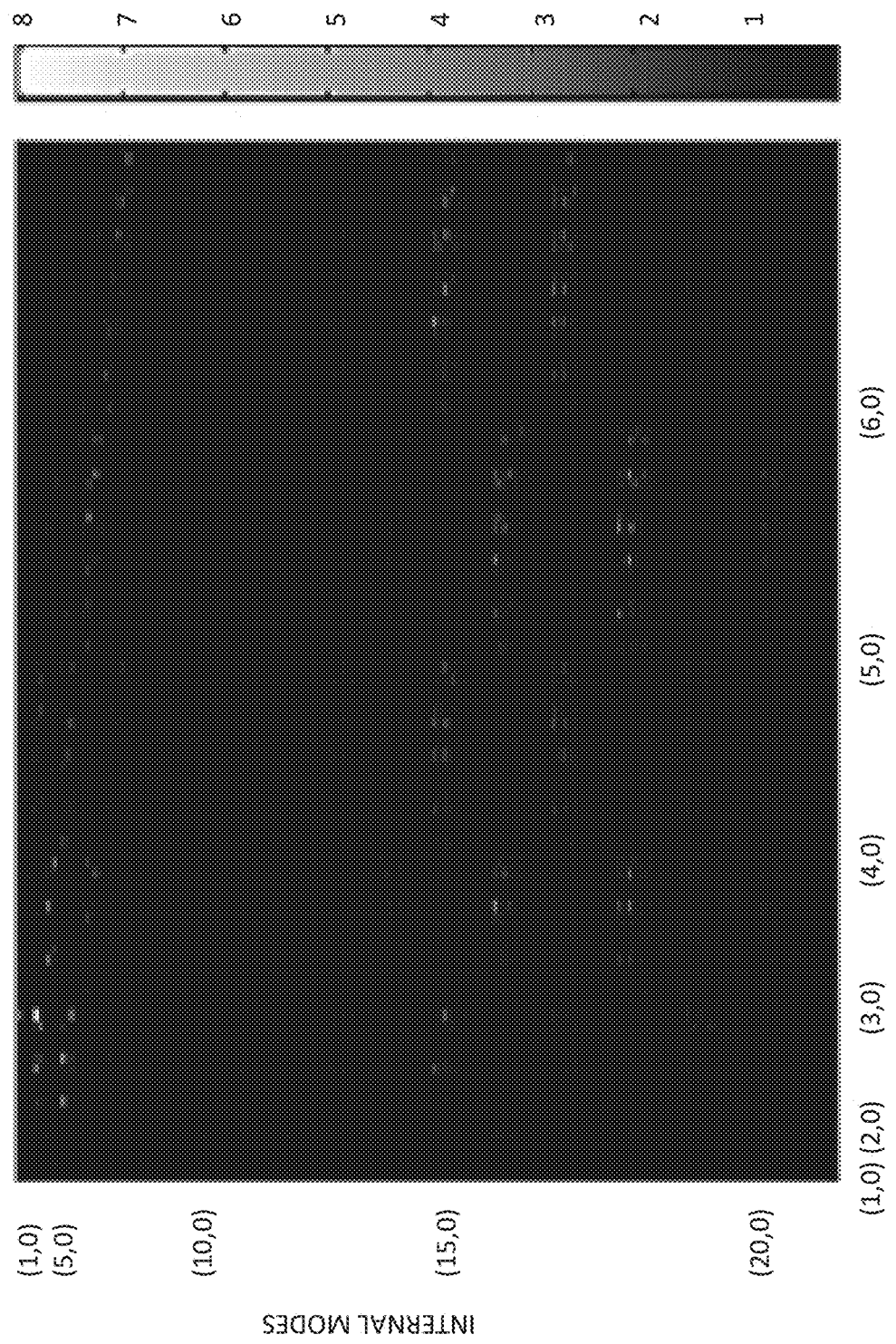

A case of more practical interest is the ellipsoidal object, which breaks the spherical symmetry that simplifies the previous case. For non-spherical objects, the distance, r, from a point on the surface to the origin depends on orientation, $r=r(\theta,\varphi)$, so the values of the radial functions, $\psi_p(kr)$ and $\chi_p(kr)$, also vary with $\theta$ and $\varphi$ on the surface. This angular variation, due to surface shape, multiplies the intrinsic angular dependence described by the mode's order and degree, (p,q). In this way, surface shape 'aliases' as angular variation on the surface: several scattering and internal modes are now required to match the boundary conditions for a single incident mode. This is reflected in the coupling matrix, which is shown for the ellipsoidal dielectric phantom in FIGS. 9A and 9B. The magnitudes of the coupling matrix elements are shown for the top, diagonal block of the matrix (lowest 6 orders for both incident and internal waves) in FIG. 9A. Recall that this matrix is diagonal for the spherical phantom. For the ellipsoidal phantom, this part of the matrix is clearly not diagonal, and in fact off-diagonal elements are dominant. The radial dependence of the surface introduces 'side-bands' of orientation (i.e., spherical harmonic) frequency at both higher and lower orders (below and above the diagonal in FIG. 9A, respectively). Because the coupling matrix can no longer be assumed diagonal, the maximum order of the internal wave cannot be assumed equal to the maximum order of the incident wave. For this reason, the internal wave modes were calculated to $p_{max}=20$, as explained above. The full coupling matrix is shown in FIG. 9B. Evidently, a result of the non-spherical surface is the introduction of significant amplitudes in high-order internal modes. These high order internal modes have limited impact on the net field uniformity in the sample, however. This is discussed below in greater detail.

Figure 10A:
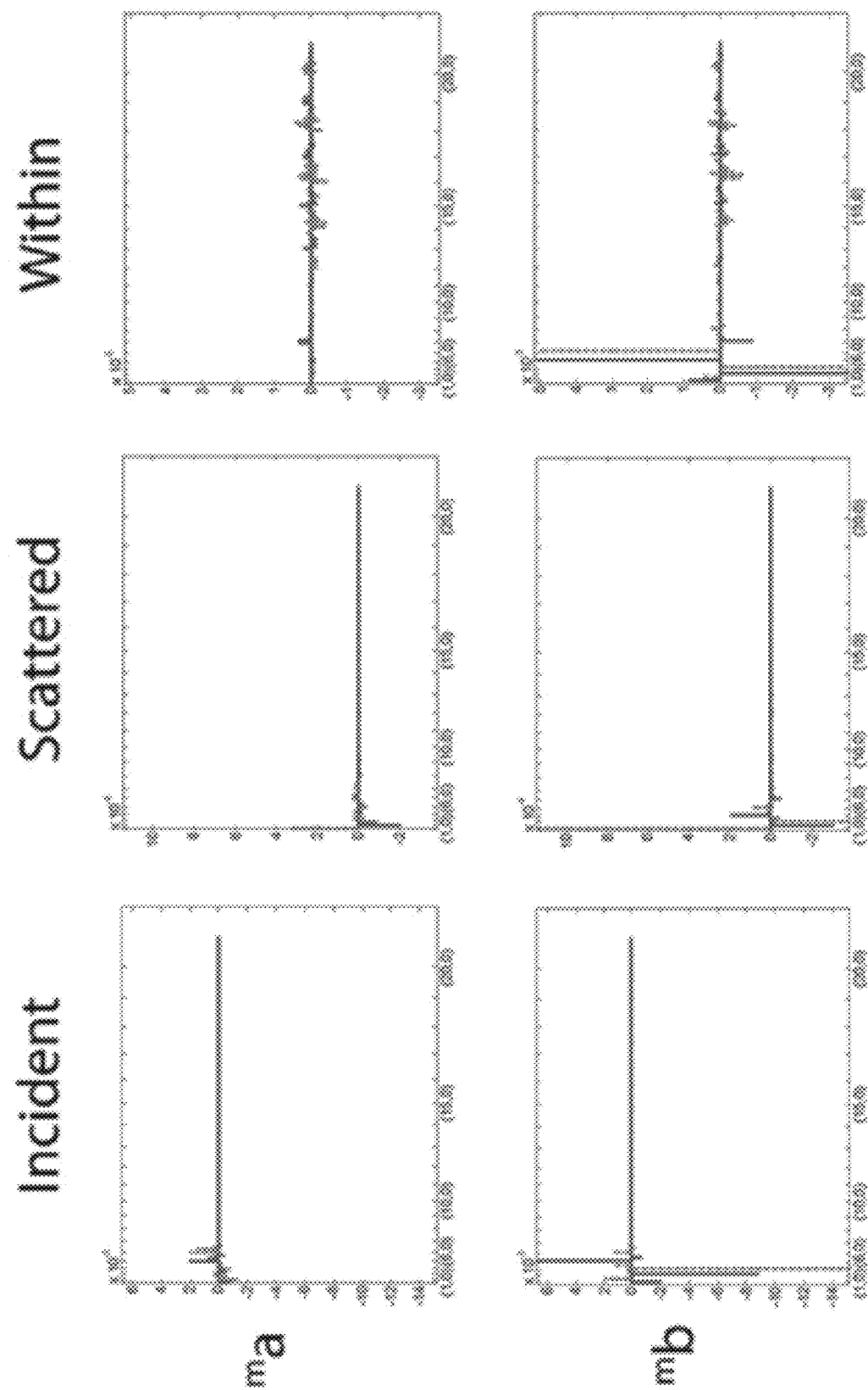
FIGS. 10A and 10B show mode amplitudes for plane wave generation in the ellipsoidal dielectric phantom. Amplitudes for the incident, scattered, and internal ('within') waves appear in the first, second, and third columns, respectively. The $^m a_{pq}$ amplitudes are plotted in standard order in the first row, followed by $^m b_{pq}$, $^e a_{pq}$, and $^e b_{pq}$ in the subsequent rows. For each amplitude, the real part is drawn with a solid blue line while the imaginary part is shown with a red dashed line. Note that relatively few modes have significant amplitude. Some high-order contamination appears in the internal wave, although this has little impact on uniformity of the field magnitude, except near the surface of the phantom.
Figure 10B:
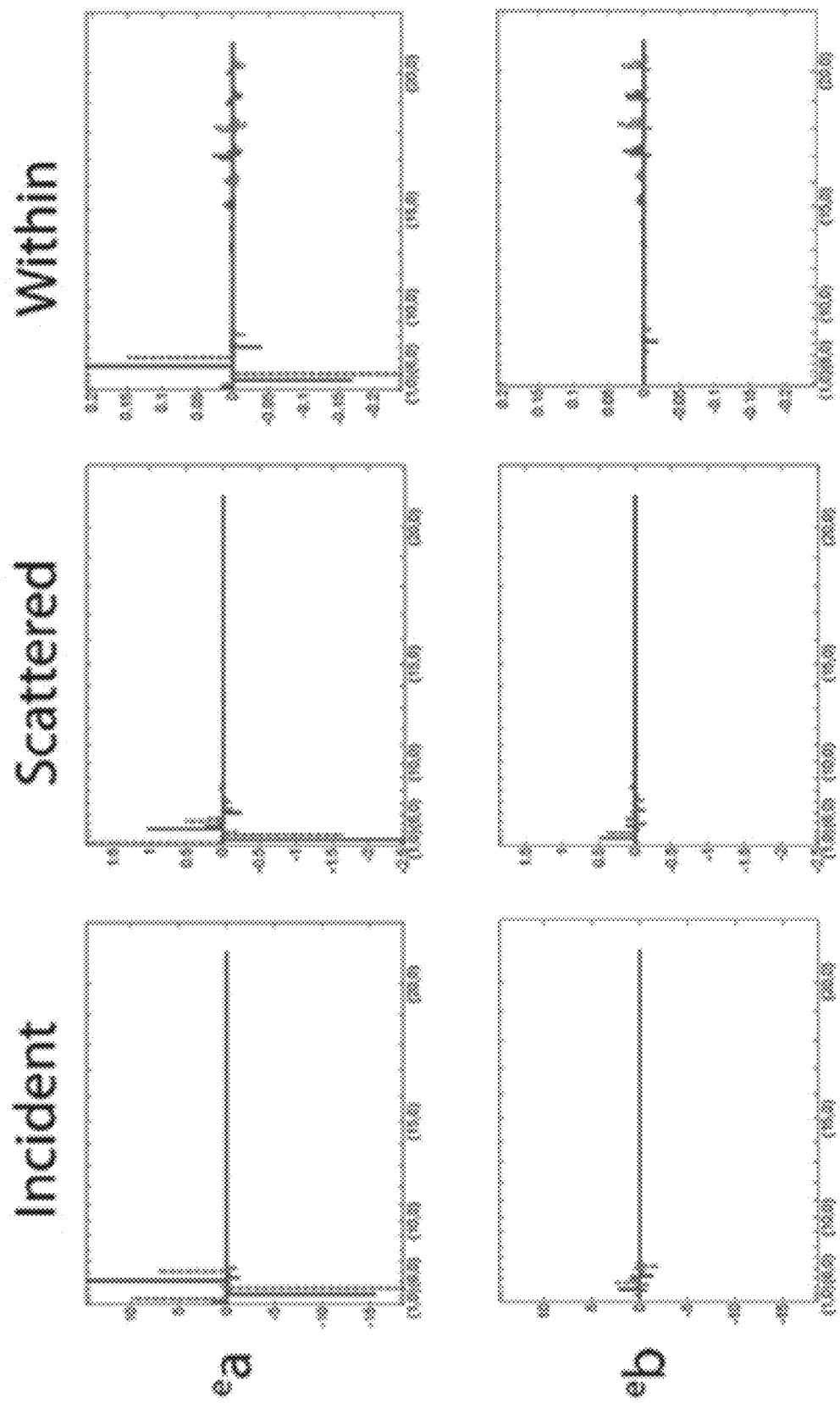
Figure 11B:
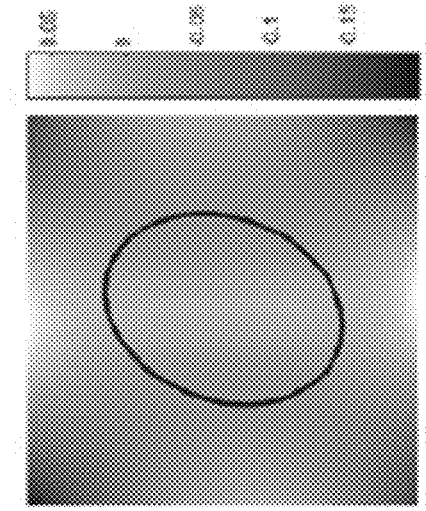
FIGS. 11A-11D show $H_y$ for the ellipsoidal dielectric phantom for an incident plane wave (FIGS. 11A and 11C) and the optimized incident wave (FIGS. 11B and 11D). The magnetic field is shown in the x=0 plane at time t=0 for the incident plane wave (FIG. 11A) and optimized wave (FIG. 11B). The magnitude of $H_y$ inside the ellipsoid is shown for the incident plane wave (FIG. 11C) and optimized wave (FIG. 11D). In both cases, the plane wave (either incident or internal) propagates to the right. Note the nearly uniform internal wavefront in (FIG. 11B) and |$H_y$| in (FIG. 11D). The units are A/m.
Figure 11D:
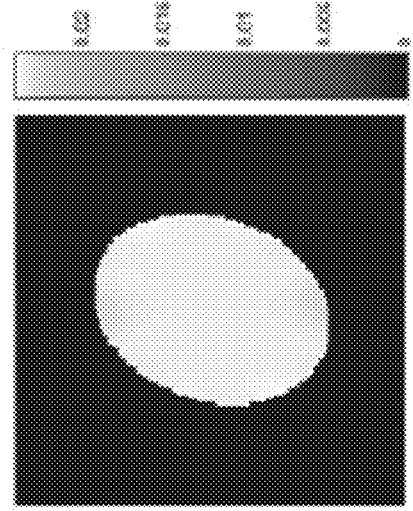
Figure 11A:
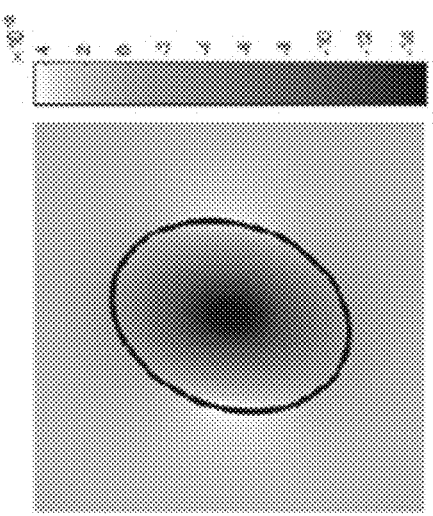
Figure 11C:
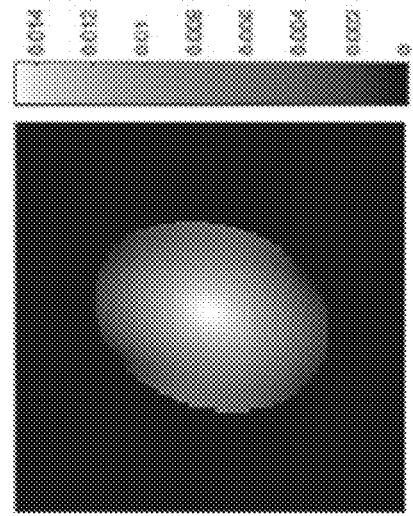

The optimized incident mode amplitudes (through $6^{th}$ order) for internal plane wave generation in the ellipsoidal dielectric phantom are shown in FIGS. 10A and 10B (left column). The corresponding scattered and internal mode amplitudes are also shown (middle and right columns, respectively). Modes of high order, both sources ('m' and 'e' potentials) and both parities are evident in the optimized internal wave. A map of the corresponding $H_y$ (in the x=0 plane) is shown in FIGS. 11B and 11D. For comparison, the corresponding map for an incident plane wave is plotted in FIGS. 11A and 11C. As for the spherical phantom, field focusing of the incident plane wave produces a strong hot spot in $H_y$ near the center of the phantom. In the ellipsoidal case, the coefficient of variation of $|H_y|$ over the volume of the phantom is 63%. For the optimized incident wave, the coefficient of variation is 0.7%. For the ellipsoidal phantom, the x-component of the magnetic field is more than two orders of magnitude smaller than the y-component. Hence, optimizing the incident wave produces a nearly uniform-magnitude, linearly polarized plane wave in the ellipsoid. While some features of the solution are different for the spherical and non-spherical cases, the method is apparently effective for both geometries.

5.2 Effects of Conductivity

Figure 12A:
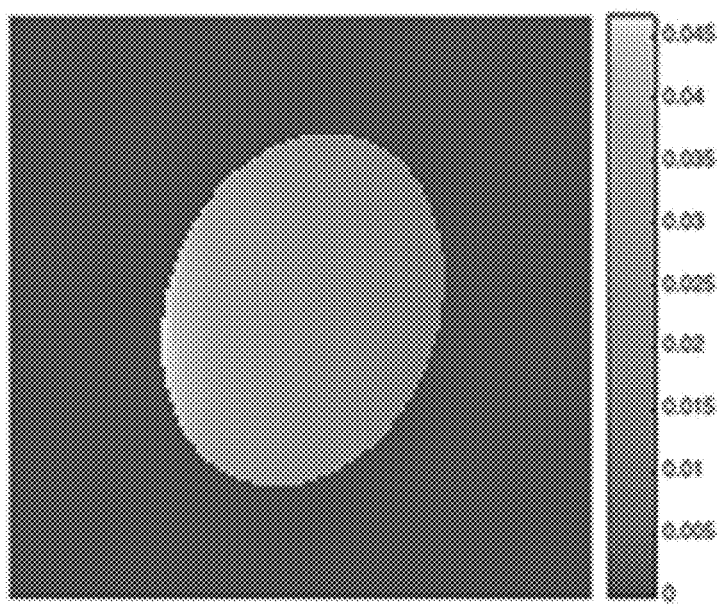
FIGS. 12A and 12B show attenuation of a plane wave traversing the conducting ellipsoid.
Figure 12B:
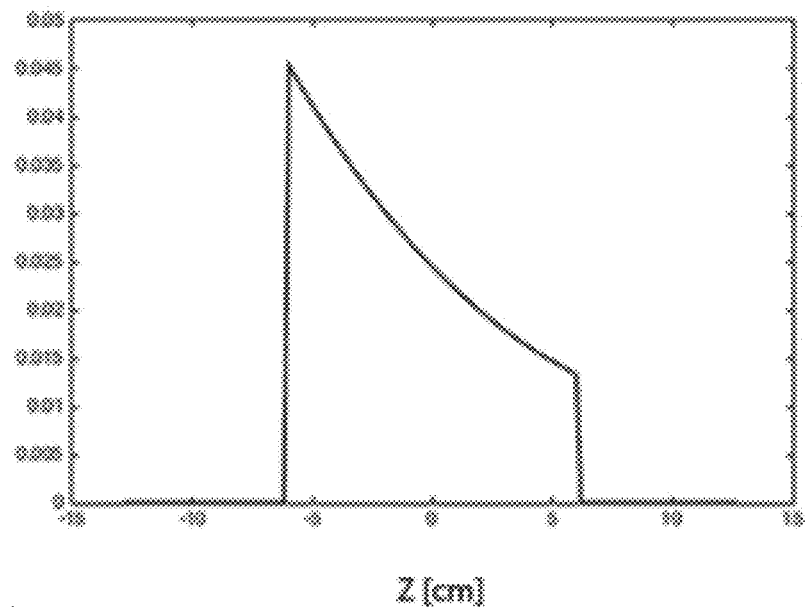

In a conducting medium, the uniformity of the internal plane wave's magnetic field decreases significantly. Limitations on RF magnetic field penetration due to the conductivity of biological tissues have been recognized since the early days of MRI. It is well known that a plane wave propagating through a conducting medium is attenuated exponentially with distance traveled—the decay constant is termed the skin depth. FIGS. 12A and 12B show the exponential decay when the conductivity of the ellipsoid is increased from zero to 0.5 S/m (approximately the conductivity of brain tissue). Values of $|H_y|$ fall by 72% from the left to the right side of the object, due to the skin depth of approximately 9.7 cm. However, the value of $|H_y|$ in any plane perpendicular to the propagation direction is nearly uniform (the maximum in-plane coefficient of variation is less than 1.6%, data not shown). Hence, multi-slice imaging is feasible in all z=constant planes, although higher transmit powers are necessary to obtain a given flip angle as z increases. Note that the propagation direction of the wave can be changed (see Appendix E) in order to obtain uniform transverse magnetic fields in oblique planes, facilitating imaging of oblique slices (although this will limit the use of circular polarization for large angles relative to the z axis). The exponential attenuation of the wave parallels the attenuation of acoustic waves in ultrasound imaging, although the physical origin of the attenuation is of course different.

The SAR in each sample voxel is calculated from the electric field $$SAR = \frac{\sigma \cdot |\vec{E}|^2}{2\rho} \tag{50}$$

where $\rho$ is the mass density of the medium (assumed to be 1 g/cm$^3$). For the geometry of FIGS. 12A and 12B, the worst case (highest SAR) arises when exciting a slice in the middle of the ellipsoid (i.e., at z=0). To produce a flip angle of 90° with a square pulse of 2 ms duration, the field amplitudes must be increased by a factor of 200 relative to the wave shown in FIG. 12. The resulting SAR, averaged over the volume of the object is 1.1 W/kg during the pulse. This is well below the 3.2 W/kg limit for the head set by the US Food and Drug Administration (FDA), for example. The peak SAR, at the leftmost edge of the object, is 47 W/kg during the pulse. Hence, these pulses would need to be separated by at least 12 ms to have a time-averaged SAR below the 8 W/kg peak value specified by the FDA.

Figure 13A:
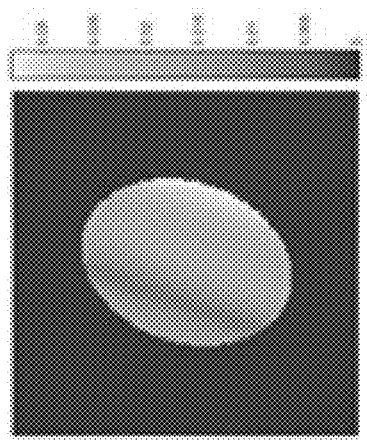
FIGS. 13A-13C show magnitudes of the magnetic fields for two counter-propagating, cross-polarized plane waves.
Figure 13B:
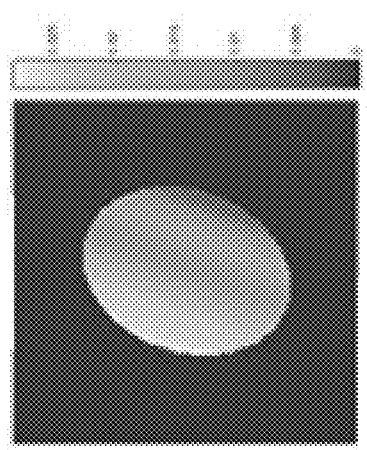
Figure 13C:
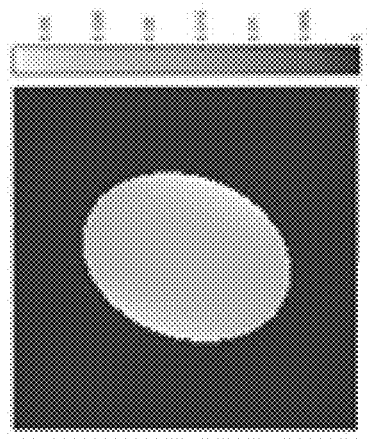

The specific absorption rate (SAR) when imaging slices beyond the center of the ellipsoid (i.e., for z>0) can be reduced by reversing the propagation direction of the internal plane wave. The results of Appendix E can be used again, in this case to calculate the Debye coefficients of a plane wave propagating in the −z direction. This wave would travel a shorter distance through the medium to reach the imaging slice, and hence would suffer less attenuation, requiring lower power at the surface. In fact, when exciting the middle slice (see above), the time-averaged peak SAR could be reduced by alternating the direction of wave propagation between consecutive pulses, to alternate locations of the SAR hot spot. A similar strategy could be used to improve the field uniformity over the entire volume: both waves (i.e., one wave propagating in the +z direction, the other in −z) could be produced simultaneously, so the attenuation of one wave would be partially compensated by the other. To prevent interference (i.e., a standing wave), the two plane waves could have orthogonal polarization (for example, $\vec{H}$ along x for one wave and along y for the other). An example for the case of oblique propagation is shown in FIGS. 13A-13C. Here the waves are rotated by the same angle as the ellipsoid, which reduces the coefficient of variation of the transverse magnetic field to less than 8% over the volume of the object, while preserving the high uniformity within planes perpendicular to the propagation directions. Orienting the wave propagation direction along the shortest dimension of the sample also increases SAR-efficiency. Better results for $|B_1^+|$ homogeneity can be obtained with a combination of several plane waves that in combination form focusing wave fronts, as shown in FIGS. 16A-16D.

5.3 RF Source Design

Figure 14B:
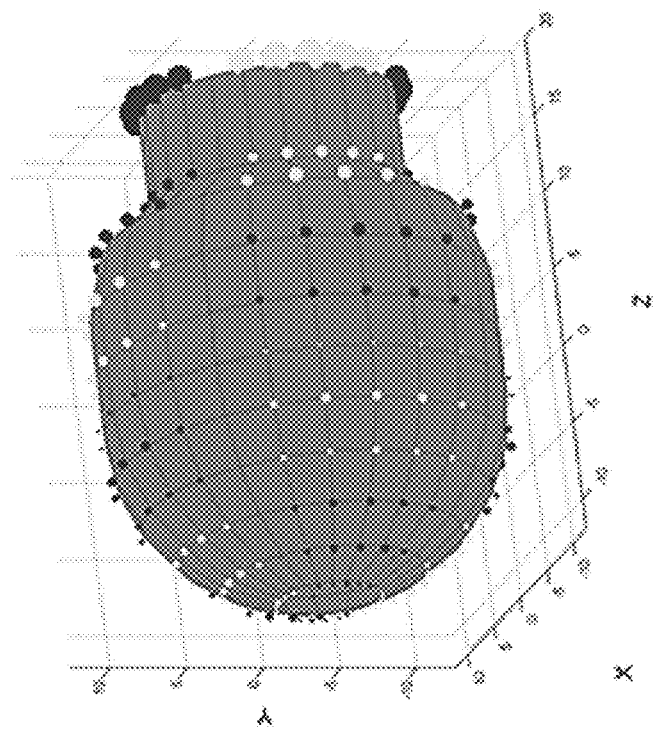
FIG. 14B shows the distribution of magnetic dipoles on the coil surface that produces the same mode. Dipole locations are indicated by small spheres—dipole amplitude is proportional to sphere volume and dipole phase angle is indicated by gray scale intensity. Note the symmetries shared by the field and dipole distribution. Coordinates are in cm.
Figure 14A:
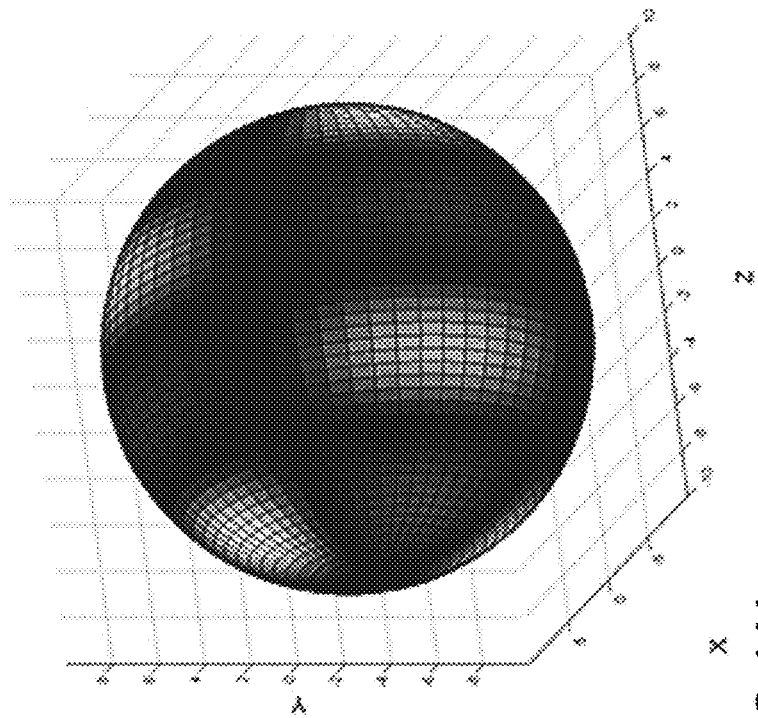
FIG. 14A shows a radial magnetic field plotted on a r=10 cm spherical observation surface for the p=5, q=2, m-mode with positive parity.

A practical challenge in implementing the method is the large number and complexity of the incident field modes that are required. The radial dipole arrays are designed to produce a wide range of incident field modes. FIGS. 14A and 14B show an example of a single field mode (the incident p=5, q=2, 'm+' mode) and the magnetic dipole amplitudes necessary to drive it. Note the similar distribution of the radial magnetic field, $H_r$, and the dipole amplitude. Equation (40) guarantees that this distribution of dipole amplitudes generates the (single) mode with the same spatial dependence on the observation sphere.

Figure 15B:
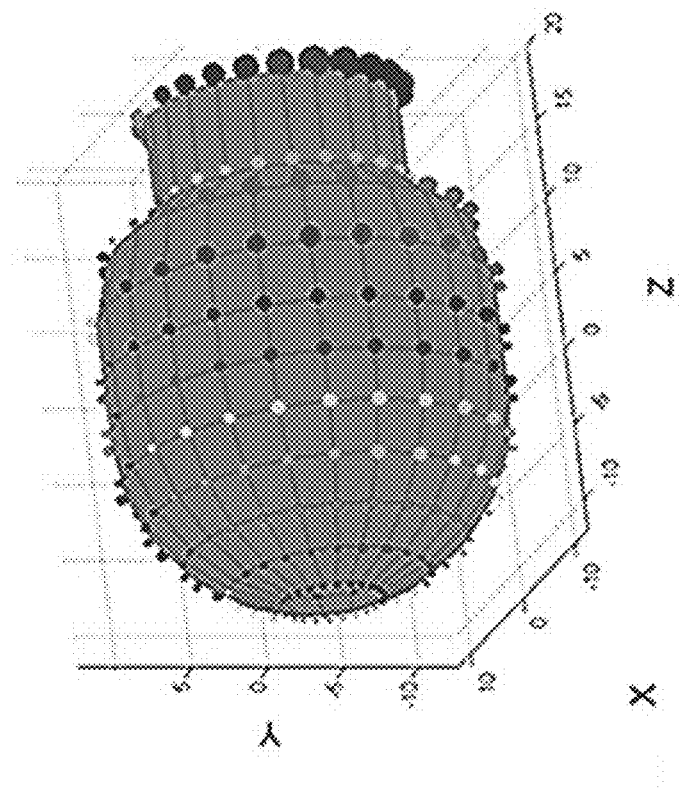
FIGS. 15A and 15B illustrate distribution of dipoles on the coil surface. Radial magnetic (FIG. 15A) and electric dipoles (FIG. 15B) that generate an internal plane wave in the ellipsoidal sample. Dipole locations are indicated by small spheres—dipole amplitude is proportional to sphere volume and dipole phase angle is indicated by gray scale intensity. Coordinates are in cm.
Figure 15A:
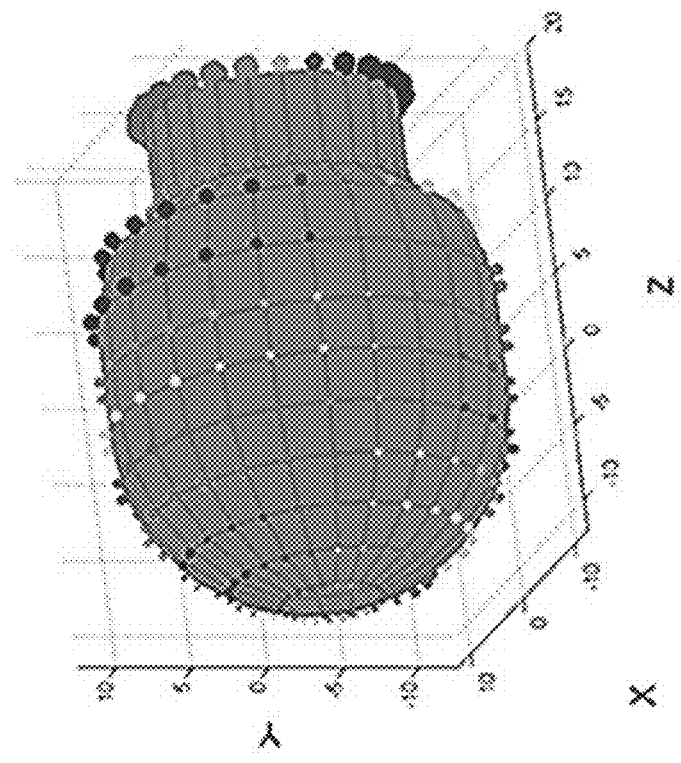

The relative dipole amplitudes that produce an internal plane wave in the dielectric, non-conducting ellipsoid are shown in FIGS. 15A and 15B. Several features of the distributions are evident. First, the amplitudes of the dipoles are generally larger with increasing distance from the origin. This simply compensates for the reduction in field strength as distance from a dipole increases. Second, for a set of dipoles at fixed azimuthal angle, the phase angle increases with z. Since the time dependence of each dipole is exp(−iωt), the phase pattern shifts to the right (toward higher z values) as time increases. This follows the propagation of the internal plane wave. A basic challenge in constructing the internal plane wave is that the wavelength in the phantom is much shorter than in free space. The tangential fields must be continuous across the surface of the phantom, so the external field must have a spatial variation on the surface of the phantom that is much more rapid than provided by the external wavelength. This is achieved by constructing a rapid spatial gradient (in z) of the dipole phases on the surface of the coil. Finally, for fixed polar angle, the larger amplitude magnetic dipoles are farther from the y=0 plane, while the larger electric dipoles are nearer the y=0 plane. This is expected since the magnetic field in the plane wave is polarized in the y (i.e., vertical) direction and the electric field is polarized in x. The magnetic dipoles are large where the radial magnetic field has a large y component (i.e., at positions with large |y|). Similarly, the electric dipoles are large where the radial electric field has a large x component (i.e., at positions with large |x|). The symmetry planes do not coincide exactly with the coordinate planes due to the rotation of the ellipsoid. For the conducting ellipsoid, the optimized dipole amplitudes (not shown) have similar features.

Although the discussion herein is primarily focused on modes generated via a combination of magnetic dipoles and electric dipoles, the various embodiments are not limited in this regard. Rather, a complete set of modes from order 1 to some maximum order (e.g., 6) can be generated using magnetic dipoles, electric dipoles, or a combination of magnetic and electric dipoles. In each case, the dipoles are positioned on the surface of a plastic former that surrounds the part of the body that is being imaged (e.g., the head, thorax, abdomen, or knee). The dipoles are composed of three mutually orthogonal elements: linear electric dipoles would be parallel to the x, y, and z axes while magnetic dipole loops would lie in planes perpendicular to the x, y, and z axes. The dipole currents that produce a given mode are calculated by linear least squares fitting: for each mode, the field values at Np positions ('observation' points) are assembled in a column vector, v, and the field values produced by unit current in each of Nd dipoles is put into one column of a (Np×Nd) matrix, X. The (complex) dipole currents that produce the desired mode are the elements of the column vector I=X"v, where X" is the pseudoinverse of X. The electronic driving network (the Modulation and Distribution Unit) is constructed to take an input signal for each mode and distribute it appropriately (i.e., in proportion to the values of the column vector I from the fitting procedure just described) to each dipole—the distribution across dipoles is fixed for each mode and therefore is hardwired. The specific distributions will be different for magnetic-only dipole arrays versus combined electric and magnetic dipole arrays, but the design approach is the same. Therefore, mode-based control can be implemented with a variety of dipole array designs using magnetic dipoles, electric dipoles, or a combination of magnetic and electric dipoles.

6. Discussion

The TIPS incident wave produces a nearly uniform $|H_y|$ in the dielectric, non-conducting samples, given the assumptions of the model. For a conducting sample, the internal plane wave has nearly uniform fields in planes normal to the direction of propagation. Although the simulations presented here were performed for 300 MHz (appropriate for 7 Tesla scanners), the method should be applicable to arbitrarily high field strengths (i.e., short internal wavelengths). As with other RF shimming methods, synthesis of a uniform-magnitude internal field provides for uniform and arbitrary flip angles. Hence, TIPS is not limited to the small tip angle regime. Although this work focuses on the production of a linearly polarized magnetic field in the sample, quadrature excitation could be achieved by superimposing the internal wave described here with another of equal amplitude, rotated by 90° around the z axis and offset in phase by 90° (see Appendix E).

The new method is based on a Debye potential description of the field. Other descriptions could also be used (e.g., the Hertz vector potential, vector spherical harmonics, or other coordinate systems) and may have advantages for optimizing scans for specific purposes, for example imaging other parts of the body. However, the Debye potentials in spherical coordinates are relatively simple and easily related to dipole sources. Hence, they provide a convenient framework for making design decisions related to the fidelity of the target field and complexity of the transmit coil.

According to Eq. (40), the coil modes provide an orthogonal and complete set of basis functions for shimming the TM and TE fields ('complete' in the sense of spanning the space of solutions to the field equations, through order $p_{max}$). Therefore, they are capable of generating any solution of Maxwell's equations through order $p_{max}$ in an empty coil. If $\tilde{C}_{p_{max}}$ is the (square) coupling matrix truncated at order $p_{max}$ and $\tilde{C}_{p_{max}}$ has full rank, then the coil can generate any solution to Maxwell's equations, including a plane wave, (to order $p_{max}$) inside a uniform dielectric sample as well. This study did not determine the optimal value of $p_{max}$, either for phantom or human studies. Note that TIPS can also be used to synthesize a superposition of multiple plane waves with different propagation directions, amplitudes, and polarizations. Such a superposition could be used to produce more uniform $|B_1^+|$ fields (as shown in FIG. 16) over the volume of a sample. In fact, plane waves form a complete set of solutions to Eq. (8) in Cartesian coordinate systems, so any physical field can be decomposed into plane wave modes. Hence, plane waves and the spherical waves derived from Debye potentials can be used as alternate descriptions of the electromagnetic field. Each alternative set of field modes (plane, spherical, or cylindrical waves) has corresponding sets of dipole array modes (on the coil former) by which they can be generated.

Furthermore, since the methods described herein can produce an internal plane wave with magnetic field polarized in the y direction, it is feasible to create a wave with magnetic field polarized in x (by rotating the distribution of all dipole currents by −90 degrees around the z axis). If the first wave is phase-shifted by −90 degrees with respect to the second, then the sum is a circularly polarized plane wave with a transverse magnetic field that rotates in the same sense as precessing nuclear spins. The transverse magnetic field rotating with the precessing spins is called the B1+ field. Therefore, the sum of the two plane waves creates a B1+ wave that is particularly efficient for spin excitation. An appropriate combination of B1+ plane waves (with different propagation directions) produces a nearly uniform $|B_1^+|$ field (see FIG. 16), which improves image uniformity.

This study also did not address the question of how many independent channels (i.e., incident field modes) would be necessary in practical brain imaging experiments. For the dielectric spherical phantom, the coupling matrix is diagonal, so only 12 channels are required to synthesize a $6^{th}$ order internal plane wave. For the rotated dielectric ellipsoid in this study, 96 channels are sufficient, although many of these have very low amplitude and therefore could be neglected with little effect on the internal wave (of the 96 modes, 50 have magnitude less than 0.1% of the maximum). However, the lowest amplitude modes will change as the ellipsoid rotation angles change, so some of those 50 modes would be needed for scanning ellipsoids in a range of orientations. Nevertheless, it is likely that fewer than 96 channels are necessary for a homogeneous ellipsoidal sample. To determine the number of channels necessary for practical brain imaging experiments, the coupling matrix should be estimated for a range of head shapes and sizes. Irregularities in the shape and material properties of the head have the effect of spreading the orientation frequency spectra of the fields, which may increase the required number of channels beyond the minimum for the simple ellipsoidal case. On the other hand, high order modes have near-zero values except near the surface of the object—this behavior is determined by the radial functions $\psi_p(kr)$ (the beginning of this trend is visible for p=6 in FIG. 4, but is more pronounced for higher orders). Hence, high order modes contribute to the fields very near the surface, but not over most of the volume of the object. So it is possible that more prominent high order modes generated in more complex objects will have modest impact on field homogeneity in most of the volume of interest.

Figure 17:
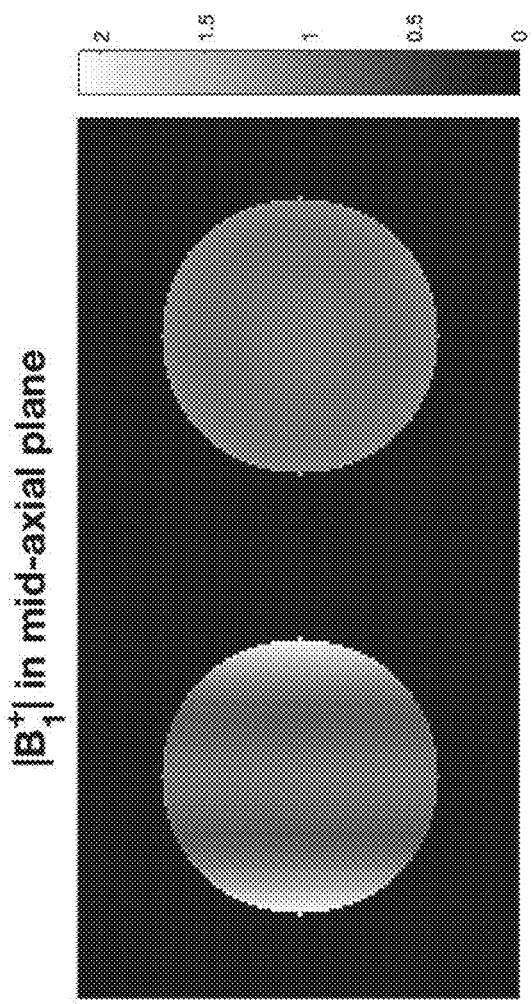
FIG. 17 shows a target field based on plane waves with field focusing (on the right side) and a conventional target field design, that does not make use of field focusing (left side).

It should be noted that although radio frequency energy losses are inevitable in biological tissues and other conducting media, field focusing can balance the losses to maintain nearly uniform $|B_1^+|$ within a volume of interest. Field focusing is efficiently achieved using appropriate combinations of field modes (optimal combinations can be determined using simulated annealing or other optimization methods). Such a target field based on plane waves is shown on the right side of FIG. 17. An earlier target field design [Wang Z J and Chu Z, J Magn Reson Imaging 24: 218 (2006); U.S. Pat. No. 7,259,562 B2], that does not make use of field focusing, is shown on the left of the figure. In both cases, the target fields were calculated for a spherical phantom (diameter=16 cm, conductivity=0.5 S/m, relative permittivity=60) imaged at 7 Tesla. The target amplitude for both fields is 1 unit (see color scale to the right of the figure). The Wang and Chu field deviates strongly from the target value as horizontal distance from the center of the sphere increases; overall, the coefficient of variation (CoV) of $|B_1^+|$ is 24% over the volume of the sphere. The target field on the right optimizes the combination of field modes to produce just enough field focusing to balance conductive losses. For this target field, the CoV of $|B_1^+|$=4% over the spherical volume. Hence the new approach to target field generation decreases field variability by more than 80% compared to the best previous (Wang and Chu) target field.

Figure 18A:
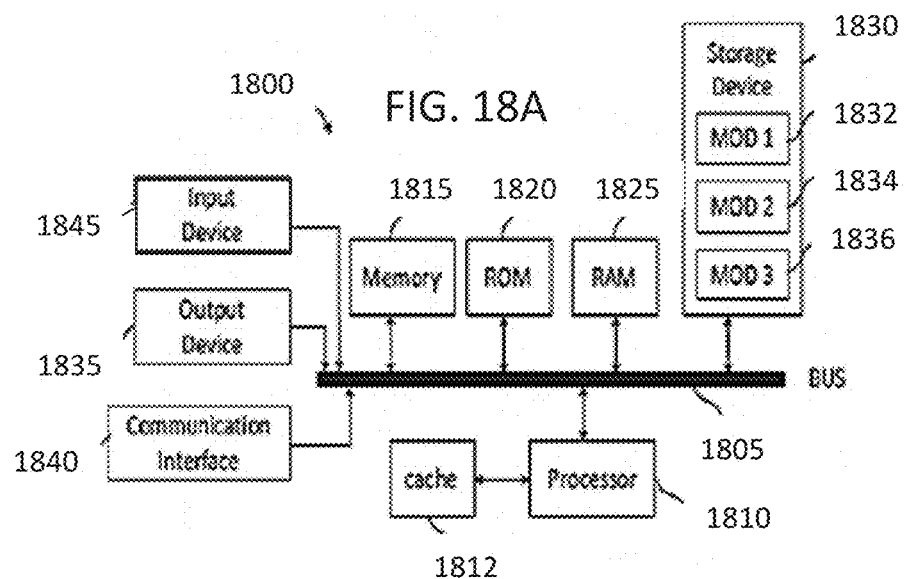
FIGS. 18A and 18B illustrate an exemplary configuration of a computing device for implementing the various embodiments.
Figure 18B:
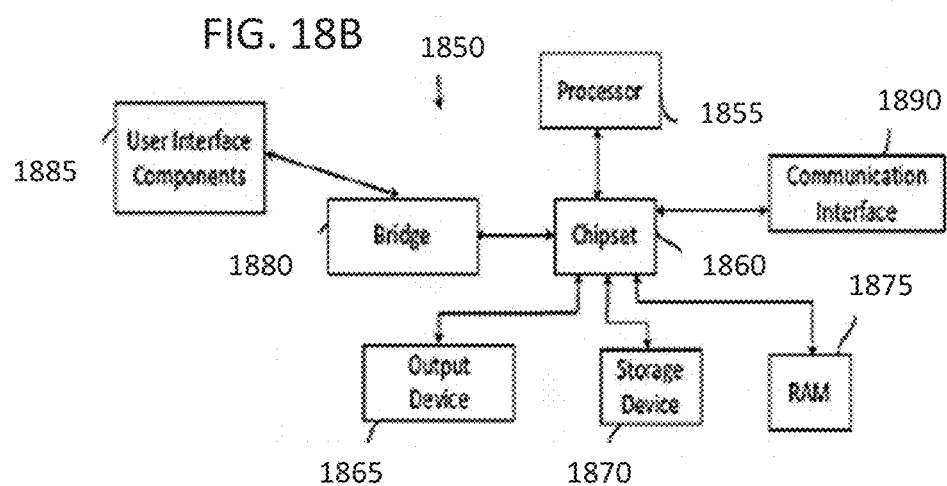

FIGS. 18A and 18B illustrate exemplary possible system embodiments. The more appropriate embodiment will be apparent to those of ordinary skill in the art when practicing the present technology. Persons of ordinary skill in the art will also readily appreciate that other system embodiments are possible.

FIG. 18A illustrates a conventional system bus computing architecture 1800 wherein the components of the system are in electrical communication with each other using a bus 1805. Exemplary system 1800 includes a processing unit (CPU or processor) 1810 and a system bus 1805 that couples various system components including the system memory 1815, such as read only memory (ROM) 1820 and random access memory (RAM) 1825, to the processor 1810. The system 1800 can include a cache of high-speed memory connected directly with, in close proximity to, or integrated as part of the processor 1810. The system 1800 can copy data from the memory 1815 and/or the storage device 1830 to the cache 1812 for quick access by the processor 1810. In this way, the cache can provide a performance boost that avoids processor 1810 delays while waiting for data. These and other modules can control or be configured to control the processor 1810 to perform various actions. Other system memory 1815 may be available for use as well. The memory 1815 can include multiple different types of memory with different performance characteristics. The processor 1810 can include any general purpose processor and a hardware module or software module, such as module 1 1832, module 2 1834, and module 3 1836 stored in storage device 1830, configured to control the processor 1810 as well as a special-purpose processor where software instructions are incorporated into the actual processor design. The processor 1810 may essentially be a completely self-contained computing system, containing multiple cores or processors, a bus, memory controller, cache, etc. A multi-core processor may be symmetric or asymmetric.

To enable user interaction with the computing device 1800, an input device 1845 can represent any number of input mechanisms, such as a microphone for speech, a touch-sensitive screen for gesture or graphical input, keyboard, mouse, motion input, speech and so forth. An output device 1835 can also be one or more of a number of output mechanisms known to those of skill in the art. In some instances, multimodal systems can enable a user to provide multiple types of input to communicate with the computing device 1800. The communications interface 1840 can generally govern and manage the user input and system output. There is no restriction on operating on any particular hardware arrangement and therefore the basic features here may easily be substituted for improved hardware or firmware arrangements as they are developed.

Storage device 1830 is a non-volatile memory and can be a hard disk or other types of computer readable media which can store data that are accessible by a computer, such as magnetic cassettes, flash memory cards, solid state memory devices, digital video disks, cartridges, random access memories (RAMs) 1825, read only memory (ROM) 1820, and hybrids thereof.

The storage device 1830 can include software modules 1832, 1834, 1836 for controlling the processor 1810. Other hardware or software modules are contemplated. The storage device 1830 can be connected to the system bus 1805. In one aspect, a hardware module that performs a particular function can include the software component stored in a computer-readable medium in connection with the necessary hardware components, such as the processor 1810, bus 1805, display 1835, and so forth, to carry out the function.

FIG. 18B illustrates a computer system 1850 having a chipset architecture that can be used in executing the described method and generating and displaying a graphical user interface (GUI). Computer system 1850 is an example of computer hardware, software, and firmware that can be used to implement the disclosed technology. System 1850 can include a processor 1855, representative of any number of physically and/or logically distinct resources capable of executing software, firmware, and hardware configured to perform identified computations. Processor 1855 can communicate with a chipset 1860 that can control input to and output from processor 1855. In this example, chipset 1860 outputs information to output 1865, such as a display, and can read and write information to storage device 1870, which can include magnetic media, and solid state media, for example. Chipset 1860 can also read data from and write data to RAM 1875. A bridge 1880 for interfacing with a variety of user interface components 1885 can be provided for interfacing with chipset 1860. Such user interface components 1885 can include a keyboard, a microphone, touch detection and processing circuitry, a pointing device, such as a mouse, and so on. In general, inputs to system 1850 can come from any of a variety of sources, machine generated and/or human generated.

Chipset 1860 can also interface with one or more communication interfaces 1890 that can have different physical interfaces. Such communication interfaces can include interfaces for wired and wireless local area networks, for broadband wireless networks, as well as personal area networks. One purpose of the interface is to support communication to the proposed Modulation and Distribution Unit (MDU) and/or other parts of the MRI scanner. This includes both data input to and output from the system 1850. Some applications of the methods for generating, displaying, and using the GUI disclosed herein can include receiving ordered datasets over the physical interface or generated by the machine itself by processor 1855 analyzing data stored in storage 1870 or 1875. Further, the machine can receive inputs from a user via user interface components 1885 and execute appropriate functions, such as browsing functions by interpreting these inputs using processor 1855.

It can be appreciated that exemplary systems 1800 and 1850 can have more than one processor 1810 or be part of a group or cluster of computing devices networked together to provide greater processing capability.

For clarity of explanation, in some instances the present technology may be presented as including individual functional blocks including functional blocks comprising devices, device components, steps or routines in a method embodied in software, or combinations of hardware and software.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during the execution of methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Further aspects of the various embodiments are described below in the following appendices.

APPENDIX A

In spherical coordinates, the curl of an arbitrary vector field $\vec{A}$ is given by $$\nabla \times \vec{A} = \frac{1}{r\sin\theta}\left[\frac{\partial}{\partial\theta}(\sin\theta A_\varphi) - \frac{\partial A_\theta}{\partial \varphi}\right]\hat{r} + \left[\frac{1}{r\sin\theta}\frac{\partial A_r}{\partial \varphi} - \frac{1}{r}\frac{\partial}{\partial r}(rA_\varphi)\right]\hat{\theta} + \frac{1}{r}\left[\frac{\partial}{\partial r}(rA_\theta) - \frac{\partial A_r}{\partial \theta}\right]\hat{\varphi} \quad (A1)$$

Applying this relation to Eq. (11), $$^eH_r = 0 \quad (A2)$$

$$^eH_\theta = -\frac{k_1}{r\sin\theta}\frac{\partial(r^e\Pi)}{\partial \varphi}$$

$$^eH_\varphi = \frac{k_1}{r}\frac{\partial(r^e\Pi)}{\partial \theta}$$

Using the top line of Eq. (7), Eq. (10), and the fact that for any scalar function $f(r,\theta,\varphi)$, $$\nabla^2 f = \frac{1}{r}\frac{\partial^2}{\partial r^2}(rf) + \frac{1}{r^2\sin\theta}\frac{\partial}{\partial \theta}\left(\sin\theta \frac{\partial f}{\partial \theta}\right) + \frac{1}{r^2\sin^2\theta}\frac{\partial^2 f}{\partial \varphi^2} \quad (A3)$$

one finds that $$^eE_r = \frac{\partial^2}{\partial r^2}(r^e\Pi) + k^2(r^e\Pi) \quad (A4)$$

Similarly, $$^eE_\theta = \frac{1}{r}\frac{\partial^2}{\partial r\partial \theta}(r^e\Pi) \quad (A5)$$

$$^eE_\varphi = \frac{1}{r\sin\theta}\frac{\partial^2}{\partial r\partial \varphi}(r^e\Pi)$$

Equations (A2) and (A4)-(A5) give the magnetic and electric fields due to $^e\Pi$ (i.e., the transverse magnetic field modes). To find the fields due to $^m\Pi$, one can apply Eq. (A1) to the top line of Eq. (12) to find $$^mE_r = 0 \quad (A6)$$

$$^mE_\theta = \frac{k_2}{r\sin\theta}\frac{\partial}{\partial \varphi}(r^m\Pi)$$

$$^mE_\varphi = -\frac{k_2}{r}\frac{\partial}{\partial \theta}(r^m\Pi)$$

The corresponding magnetic field is found from the bottom line of Eq. (7), again using Eqs. (A3) and (10), $$^mH_r = \frac{\partial^2}{\partial r^2}(r^m\Pi) + k^2(r^m\Pi) \quad (A7)$$

$$^mH_\theta = \frac{1}{r}\frac{\partial^2}{\partial r\partial \theta}(r^m\Pi)$$

$$^mH_\varphi = \frac{1}{r\sin\theta}\frac{\partial^2}{\partial r\partial \varphi}(r^m\Pi)$$

Equations (A6)-(A7) give the electric and magnetic fields in the transverse electric modes. The total fields are the sums of the transverse magnetic and transverse electric contributions:

$$\vec{H} = ^e\vec{H} + ^m\vec{H}$$
$$\vec{E} = ^e\vec{E} + ^m\vec{E} \quad (A8)$$

APPENDIX B

The goal here is to express the fields in each wave (within the sample, incident, and scattered) in terms of the coefficients of the Debye potentials. Each component of the total field can be written as a sum of field modes. For example, $$H_r = ^eH_r + ^mH_r \quad (B1)$$

Using Eqs. (A2), (A7), and one finds $$H_r = \sum_{p=0}^{\infty}\sum_{q=-p}^{p}\left(\frac{p(p+1)}{r^2}\right)r^m\Pi_{pq} \quad (B2)$$

Note that the term for p=0 is zero. In fact, the wave potentials in Eqs. (18), (19), and (21) are independent of $\theta$ and $\varphi$ for p=0 (which implies q=0). Inspection of Eqs. (A2) and (A4)-(A7) reveals that all fields are zero for p=0. Hence the p=0 term can be dropped from the summation here and in Eq. (13). In addition, the terms for degree q and −q are proportional, so terms for q<0 can be neglected. Finally, for q=0 the sin(q$\varphi$) terms in the Debye potentials are identically zero, so one can set the $b_{p0}$ coefficients to zero without loss of generality. Hence, for given p, there are 2p+1 free coefficients. To reduce repetition in the field calculations, one can define $$k = \begin{cases} k^{(I)} & \text{for the incident and scattered waves} \\ k^{(II)} & \text{for the wave within the sample} \end{cases} \quad (B3)$$

Analogous definitions apply for $k_1$ and $k_2$. Introducing the radial function $$f_p(kr) = \begin{cases} \psi_p(kr) & \text{for the incident and within-sample waves} \\ \zeta_p(kr) & \text{for the scattered wave} \end{cases} \quad (B4)$$

one can write general expressions for the Debye potentials in each of the three waves:

$$r \, {}^e\Pi_{pq}^{(\cdot)} = \frac{r \alpha_{pq}^{(\cdot)}}{k^2} f_p(kr) P_{pq}(\cos\theta)[{}^e a_{pq}^{(\cdot)}\cos(q\varphi) + {}^e b_{pq}^{(\cdot)}\sin(q\varphi)] \quad (B5)$$

$$r \, {}^m\Pi_{pq}^{(\cdot)} = \frac{i \cdot {}^m \alpha_{pq}^{(\cdot)}}{kk_2} f_p(kr) P_{pq}(\cos\theta)[{}^m a_{pq}^{(\cdot)}\cos(q\varphi) + {}^m b_{pq}^{(\cdot)}\sin(q\varphi)]$$

where the dot superscript signifies any one of the three wave labels (i, w, or s).

Substituting Eq. (B5) into Eq. (B2), the magnetic field within the sample can be written $$H_r^{(\cdot)} = \sum_{p=1}^{\infty} \sum_{q=0}^{p} \{{}^m a_{pq}^{(\cdot)} \cdot {}^{m+}h_{rpq}^{(\cdot)} + {}^m b_{pq}^{(\cdot)} \cdot {}^{m-}h_{rpq}^{(\cdot)}\} \quad (B6)$$

where $$^{m+}h_{rpq}^{(\cdot)} = i \cdot {}^m \alpha_{pq}^{(\cdot)} \frac{p(p+1)}{kk_2 r^2} f_p(kr) P_{pq}(\cos\theta)\cos(q\varphi) \quad (B7)$$

$$^{m-}h_{rpq}^{(\cdot)} = i \cdot {}^m \alpha_{pq}^{(\cdot)} \frac{p(p+1)}{kk_2 r^2} f_p(kr) P_{pq}(\cos\theta)\sin(q\varphi)$$

and the '+' and '−' superscripts give the parity of the function in $\varphi$ ('+' for even functions and '−' for odd functions of $\varphi$). The functions ${}^{m+}h_{rpq}^{(\cdot)}$ and ${}^{m-}h_{rpq}^{(\cdot)}$ give the radial magnetic field per unit of the coefficients ${}^m a_{pq}^{(\cdot)}$ and ${}^m b_{pq}^{(\cdot)}$, respectively.

The calculation of $H_\theta$ is similar except both e and m wave potentials contribute:

$$H_\theta = {}^e H_\theta + {}^m H_\theta \quad (B8)$$

$$= -\frac{k_1}{r\sin\theta} \frac{\partial(r {}^e\Pi)}{\partial\varphi} + \frac{1}{r}\frac{\partial^2}{\partial r \partial \theta}(r {}^m\Pi)$$

using Eqs. (A8), (A2), and (A7). Substituting from Eq. (B5) gives $$H_\theta^{(\cdot)} = \sum_{p=1}^{\infty} \sum_{q=0}^{p} \{{}^e a_{pq}^{(\cdot)} \cdot {}^{e+}h_{\theta pq}^{(\cdot)} + \quad (B9)$$

$$^e b_{pq}^{(\cdot)} \cdot {}^{e-}h_{\theta pq}^{(\cdot)} + {}^m a_{pq}^{(\cdot)} \cdot {}^{m+}h_{\theta pq}^{(\cdot)} + {}^m b_{pq}^{(\cdot)} \cdot {}^{m-}h_{\theta pq}^{(\cdot)}\}$$

where $$^{e+}h_{\theta pq}^{(\cdot)} = {}^e \alpha_{pq}^{(\cdot)} \frac{k_1}{k^2 r \sin\theta} f_p(kr) P_{pq}(\cos\theta) q\sin(q\varphi) \quad (B10)$$

$$^{e-}h_{\theta pq}^{(\cdot)} = -{}^e \alpha_{pq}^{(\cdot)} \frac{k_1}{k^2 r \sin\theta} f_p(kr) P_{pq}(\cos\theta) q\cos(q\varphi)$$

$$^{m+}h_{\theta pq}^{(\cdot)} = {}^m \alpha_{pq}^{(\cdot)} \frac{i}{k_2 r} f_p'(kr) \frac{\partial}{\partial\theta} P_{pq}(\cos\theta)\cos(q\varphi)$$

$$^{m-}h_{\theta pq}^{(\cdot)} = {}^m \alpha_{pq}^{(\cdot)} \frac{i}{k_2 r} f_p'(kr) \frac{\partial}{\partial\theta} P_{pq}(\cos\theta)\sin(q\varphi)$$

and a prime (') denotes differentiation with respect to the function's argument.

The $\varphi$ component of the magnetic field is $$H_\varphi^{(\cdot)} = {}^e H_\varphi^{(\cdot)} + {}^m H_\varphi^{(\cdot)} \quad (B11)$$

$$= \frac{k_1}{r}\frac{\partial(r {}^e\Pi^{(\cdot)})}{\partial\theta} + \frac{1}{r\sin\theta}\frac{\partial^2}{\partial r \partial\varphi}(r {}^m\Pi^{(\cdot)})$$

$$= \sum_{p=1}^{\infty} \sum_{q=0}^{p} \{{}^e a_{pq}^{(\cdot)} \cdot {}^{e+}h_{\varphi pq}^{(\cdot)} + {}^e b_{pq}^{(\cdot)} \cdot {}^{e-}h_{\varphi pq}^{(\cdot)} +$$

$$^m a_{pq}^{(\cdot)} \cdot {}^{m+}h_{\varphi pq}^{(\cdot)} + {}^m b_{pq}^{(\cdot)} \cdot {}^{m-}h_{\varphi pq}^{(\cdot)}\}$$

using Eqs. (A2), (A7), and the definitions $$^{e+}h_{\varphi pq}^{(\cdot)} = {}^e \alpha_{pq}^{(\cdot)} \frac{k_1}{k^2 r} f_p(kr) \frac{\partial}{\partial\theta} P_{pq}(\cos\theta)\cos(q\varphi) \quad (B12)$$

$$^{e-}h_{\varphi pq}^{(\cdot)} = {}^e \alpha_{pq}^{(\cdot)} \frac{k_1}{k^2 r} f_p(kr) \frac{\partial}{\partial\theta} P_{pq}(\cos\theta)\sin(q\varphi)$$

$$^{m+}h_{\varphi pq}^{(\cdot)} = -{}^m \alpha_{pq}^{(\cdot)} \frac{i}{k_2 r\sin\theta} f_p'(kr) P_{pq}(\cos\theta) q\sin(q\varphi)$$

$$^{m-}h_{\varphi pq}^{(\cdot)} = {}^m \alpha_{pq}^{(\cdot)} \frac{i}{k_2 r \sin\theta} f_p'(kr) P_{pq}(\cos\theta) q\cos(q\varphi)$$

The electric fields are calculated analogously. One has $$E_r^{(\cdot)} = {}^e E_r^{(\cdot)} \quad (B13)$$

$$= \frac{\partial^2}{\partial r^2}(r {}^e\Pi^{(\cdot)}) + k^2(r {}^e\Pi^{(\cdot)})$$

$$= \sum_{p=1}^{\infty} \sum_{q=0}^{p} \left(\frac{p(p+1)}{r^2}\right) r {}^e\Pi_{pq}^{(\cdot)}$$

$$= \sum_{p=1}^{\infty} \sum_{q=0}^{p} \{{}^e a_{pq}^{(\cdot)} \cdot {}^{e+}e_{rpq}^{(\cdot)} + {}^e b_{pq}^{(\cdot)} \cdot {}^{e-}e_{rpq}^{(\cdot)}\}$$

where the functions ${}^{e+}e_{rpq}^{(\cdot)}(r,\theta,\varphi)$ and ${}^{e-}e_{rpq}^{(\cdot)}(r,\theta,\varphi)$ give the electric field per unit of the coefficients ${}^e a_{pq}^{(\cdot)}$ and ${}^e b_{pq}^{(\cdot)}$, respectively:

$$^{e+}e_{rpq}^{(\cdot)} = {}^e \alpha_{rpq}^{(\cdot)} \frac{p(p+1)}{(kr)^2} f_p(kr) P_{pq}(\cos\theta)\cos(q\varphi) \quad (B14)$$

$$^{e+}e_{rpq}^{(\cdot)} = {}^e \alpha_{rpq}^{(\cdot)} \frac{p(p+1)}{(kr)^2} f_p(kr) P_{pq}(\cos\theta)\sin(q\varphi)$$

The θ component of the electric field is $$E_\theta^{(\cdot)} = {}^eE_\theta^{(\cdot)} + {}^mE_\theta^{(\cdot)} \qquad (B15)$$
$$= \frac{1}{r}\frac{\partial^2}{\partial r\partial\theta}(r\,{}^e\Pi^{(\cdot)}) + \frac{k_2}{r\sin\theta}\frac{\partial}{\partial\varphi}(r\,{}^m\Pi^{(\cdot)})$$
$$= \sum_{p=1}^{\infty}\sum_{q=0}^{p}\{{}^ea_{pq}^{(\cdot)}\cdot{}^{e+}e_{\theta pq}^{(\cdot)} + {}^eb_{pq}^{(\cdot)}\cdot{}^{e+}e_{\theta pq}^{(\cdot)} +$$
$${}^ma_{pq}^{(\cdot)}\cdot{}^{m+}e_{\theta pq}^{(\cdot)} + {}^mb_{pq}^{(\cdot)}\cdot{}^{m-}e_{\theta pq}^{(\cdot)}\}$$

where $$\begin{aligned}
{}^{e+}e_{\theta pq}^{(\cdot)} &= {}^e\alpha_{pq}^{(\cdot)}\frac{1}{kr}f_p'(kr)\frac{\partial}{\partial\theta}P_{pq}(\cos\theta)\cos(q\varphi) \\
{}^{e-}e_{\theta pq}^{(\cdot)} &= {}^e\alpha_{pq}^{(\cdot)}\frac{1}{kr}f_p'(kr)\frac{\partial}{\partial\theta}P_{pq}(\cos\theta)\sin(q\varphi) \\
{}^{m+}e_{\theta pq}^{(\cdot)} &= -{}^m\alpha_{pq}^{(\cdot)}\frac{i}{kr\sin\theta}f_p(kr)P_{pq}(\cos\theta)q\sin(q\varphi) \\
{}^{m-}e_{\theta pq}^{(\cdot)} &= {}^m\alpha_{pq}^{(\cdot)}\frac{i}{kr\sin\theta}f_p(kr)P_{pq}(\cos\theta)q\cos(q\varphi)
\end{aligned} \qquad (B16)$$

Finally, the φ component is given by $$E_\varphi^{(\cdot)} = {}^eE_\varphi^{(\cdot)} + {}^mE_\varphi^{(\cdot)} \qquad (B17)$$
$$= \frac{1}{r\sin\theta}\frac{\partial^2}{\partial r\partial\varphi}(r\,{}^e\Pi^{(\cdot)}) - \frac{k_2}{r}\frac{\partial}{\partial\theta}(r\,{}^m\Pi^{(\cdot)})$$
$$= \sum_{p=1}^{\infty}\sum_{q=0}^{p}\{{}^ea_{pq}^{(\cdot)}\cdot{}^{e+}e_{\varphi pq}^{(\cdot)} + {}^eb_{pq}^{(\cdot)}\cdot{}^{e+}e_{\varphi pq}^{(\cdot)} +$$
$${}^ma_{pq}^{(\cdot)}\cdot{}^{m+}e_{\varphi pq}^{(\cdot)} + {}^mb_{pq}^{(\cdot)}\cdot{}^{m-}e_{\varphi pq}^{(\cdot)}\}$$

where $$\begin{aligned}
{}^{e+}e_{\varphi pq}^{(\cdot)} &= {}^e\alpha_{pq}^{(\cdot)}\frac{1}{kr\sin\theta}f_p'(kr)P_{pq}(\cos\theta)q\sin(q\varphi) \\
{}^{e-}e_{\varphi pq}^{(\cdot)} &= {}^e\alpha_{pq}^{(\cdot)}\frac{1}{kr\sin\theta}f_p'(kr)P_{pq}(\cos\theta)q\cos(q\varphi) \\
{}^{m+}e_{\varphi pq}^{(\cdot)} &= -{}^m\alpha_{pq}^{(\cdot)}\frac{i}{kr}f_p(kr)\frac{\partial}{\partial\theta}P_{pq}(\cos\theta)\cos(q\varphi) \\
{}^{m-}e_{\varphi pq}^{(\cdot)} &= -{}^m\alpha_{pq}^{(\cdot)}\frac{i}{kr}f_p(kr)\frac{\partial}{\partial\theta}P_{pq}(\cos\theta)\sin(q\varphi)
\end{aligned} \qquad (B18)$$

According to Eqs. (B6), (B9), (B11), (B13), (B15), and (B17), the fields in each wave are determined by the four coefficients ${}^ea_{pq}^{(\cdot)}$, ${}^eb_{pq}^{(\cdot)}$, ${}^ma_{pq}^{(\cdot)}$, and ${}^mb_{pq}^{(\cdot)}$ for each order and degree (two coefficients for q=0).

The Cartesian components of the fields can be calculated from the spherical components by $$H_x = H_r\sin\theta\cos\varphi + H_\theta\cos\theta\cos\varphi - H_\varphi\sin\varphi$$

$$H_y = H_r\sin\theta\sin\varphi + H_\theta\cos\theta\sin\varphi + H_\varphi\cos\varphi$$

$$H_z = H_r\cos\theta - H_\theta\sin\theta \qquad (B19)$$

So for any of the three waves, the x component of the magnetic field can be written in terms of the Debye potential coefficients as $$H_x^{(\cdot)} = \sum_{p=1}^{\infty}\sum_{q=0}^{p}\{[{}^ma_{pq}^{(\cdot)}\cdot{}^{m+}h_{rpq}^{(\cdot)} + {}^mb_{pq}^{(\cdot)}\cdot{}^{m-}h_{rpq}^{(\cdot)}]\sin\theta\cos\varphi + \qquad (B20)$$
$$[{}^ea_{pq}^{(\cdot)}\cdot{}^{e+}h_{\theta pq}^{(\cdot)} + {}^eb_{pq}^{(\cdot)}\cdot{}^{e-}h_{\theta pq}^{(\cdot)} + {}^ma_{pq}^{(\cdot)}\cdot{}^{m+}h_{\theta pq}^{(\cdot)} + {}^mb_{pq}^{(\cdot)}\cdot{}^{m-}h_{\theta pq}^{(\cdot)}]$$
$$\cos\theta\cos\varphi -$$
$$[{}^ea_{pq}^{(\cdot)}\cdot{}^{e+}h_{\varphi pq}^{(\cdot)} + {}^eb_{pq}^{(\cdot)}\cdot{}^{e-}h_{\varphi pq}^{(\cdot)} +$$
$${}^ma_{pq}^{(\cdot)}\cdot{}^{m+}h_{\varphi pq}^{(\cdot)} + {}^mb_{pq}^{(\cdot)}\cdot{}^{m-}h_{\varphi pq}^{(\cdot)}]\sin\varphi\}$$
$$= \sum_{p=1}^{\infty}\sum_{q=0}^{p}\{{}^ea_{pq}^{(\cdot)}\cdot{}^{e+}h_{xpq}^{(\cdot)} + {}^eb_{pq}^{(\cdot)}\cdot{}^{e-}h_{xpq}^{(\cdot)} +$$
$${}^ma_{pq}^{(\cdot)}\cdot{}^{m+}h_{xpq}^{(\cdot)} + {}^mb_{pq}^{(\cdot)}\cdot{}^{m-}h_{xpq}^{(\cdot)}\}$$

where $$\begin{aligned}
{}^{e+}h_{xpq}^{(\cdot)} &= {}^{e+}h_{\theta pq}^{(\cdot)}\cos\theta\cos\varphi - {}^{e+}h_{\varphi pq}^{(\cdot)}\sin\varphi \\
{}^{e-}h_{xpq}^{(\cdot)} &= {}^{e-}h_{\theta pq}^{(\cdot)}\cos\theta\cos\varphi - {}^{e-}h_{\varphi pq}^{(\cdot)}\sin\varphi \\
{}^{m+}h_{xpq}^{(\cdot)} &= {}^{m+}h_{rpq}^{(\cdot)}\sin\theta\cos\varphi + {}^{m+}h_{\theta pq}^{(\cdot)}\cos\theta\cos\varphi - {}^{m+}h_{\varphi pq}^{(\cdot)}\sin\varphi \\
{}^{m-}h_{xpq}^{(\cdot)} &= {}^{m-}h_{rpq}^{(\cdot)}\sin\theta\cos\varphi + {}^{m-}h_{\theta pq}^{(\cdot)}\cos\theta\cos\varphi - {}^{m-}h_{\varphi pq}^{(\cdot)}\sin\varphi
\end{aligned} \qquad (B21)$$

Similarly, $$H_y^{(\cdot)} = \sum_{p=1}^{\infty}\sum_{q=0}^{p}\{{}^ea_{pq}^{(\cdot)}\cdot{}^{e+}h_{ypq}^{(\cdot)} + \qquad (B22)$$
$${}^eb_{pq}^{(\cdot)}\cdot{}^{e-}h_{ypq}^{(\cdot)} + {}^ma_{pq}^{(\cdot)}\cdot{}^{m+}h_{ypq}^{(\cdot)} + {}^mb_{pq}^{(\cdot)}\cdot{}^{m-}h_{ypq}^{(\cdot)}\}$$

with $$\begin{aligned}
{}^{e+}h_{ypq}^{(\cdot)} &= {}^{e+}h_{\theta pq}^{(\cdot)}\cos\theta\sin\varphi + {}^{e+}h_{\varphi pq}^{(\cdot)}\cos\varphi \\
{}^{e-}h_{ypq}^{(\cdot)} &= {}^{e-}h_{\theta pq}^{(\cdot)}\cos\theta\sin\varphi + {}^{e-}h_{\varphi pq}^{(\cdot)}\cos\varphi \\
{}^{m+}h_{ypq}^{(\cdot)} &= {}^{m+}h_{rpq}^{(\cdot)}\sin\theta\sin\varphi + {}^{m+}h_{\theta pq}^{(\cdot)}\cos\theta\sin\varphi + {}^{m+}h_{\varphi pq}^{(\cdot)}\cos\varphi \\
{}^{m-}h_{ypq}^{(\cdot)} &= {}^{m-}h_{rpq}^{(\cdot)}\sin\theta\sin\varphi + {}^{m-}h_{\theta pq}^{(\cdot)}\cos\theta\sin\varphi + {}^{m-}h_{\varphi pq}^{(\cdot)}\cos\varphi
\end{aligned} \qquad (B23)$$

and $$H_z^{(\cdot)} = \sum_{p=1}^{\infty}\sum_{q=0}^{p}\{{}^ea_{pq}^{(\cdot)}\cdot{}^{e+}h_{zpq}^{(\cdot)} + {}^eb_{pq}^{(\cdot)}\cdot{}^{e-}h_{zpq}^{(\cdot)} + {}^ma_{pq}^{(\cdot)}\cdot{}^{m+}h_{zpq}^{(\cdot)} + {}^mb_{pq}^{(\cdot)}\cdot{}^{m-}h_{zpq}^{(\cdot)}\} \qquad (B24)$$

where $$\begin{aligned}
{}^{e+}h_{zpq}^{(\cdot)} &= -{}^{e+}h_{\theta pq}^{(\cdot)}\sin\theta \\
{}^{e-}h_{zpq}^{(\cdot)} &= -{}^{e-}h_{\theta pq}^{(\cdot)}\sin\theta \\
{}^{m+}h_{zpq}^{(\cdot)} &= {}^{m+}h_{zpq}^{(\cdot)}\cos\theta - {}^{m+}h_{\theta pq}^{(\cdot)}\sin\theta \\
{}^{m-}h_{zpq}^{(\cdot)} &= {}^{m-}h_{zpq}^{(\cdot)}\cos\theta - {}^{m-}h_{\theta pq}^{(\cdot)}\sin\theta
\end{aligned} \qquad (B25)$$

The Cartesian components of the electric fields can be found in the same way.

APPENDIX C

To put the mode coefficients in a useful range of magnitudes, one can choose the ${}^m\alpha_{pq}^{(\cdot)}$ scaling constants so a coefficient ${}^ma_{pq}^{(\cdot)}$ or ${}^mb_{pq}^{(\cdot)}=1$ corresponds to a root-mean-square (RMS) value of $H_r$ equal to 1, averaged over the surface of a sphere of radius $r_0=10$ cm (and over a cycle through time). The scaling constants ${}^e\alpha_{pq}^{(\cdot)}$ are chosen analogously: a unit magnitude ${}^ea_{pq}^{(\cdot)}$ or ${}^eb_{pq}^{(\cdot)}$ coefficient corresponds to unit RMS value of $E_r$, averaged over the surface of the 10 cm sphere (and over time).

For unit amplitude of the wave mode of order p, degree q and positive parity in φ, the RMS value of $H_r$ is $$(H_r^{(\cdot)})_{RMS} = \left[\frac{1}{4\pi}\int\left(\frac{1}{2}|^{m+}h_{rpq}^{(\cdot)}|^2\right)\sin\theta d\theta d\varphi\right]^{1/2} \quad \text{(C1)}$$

where the factor of ½ accounts for the average over a cycle in time ($2\pi/\omega$). Substituting from Eq. (B7) and using the relation $$\int_0^\pi P_{pq}(\cos\theta)P_{lq}(\cos\theta)\sin\theta d\theta = \frac{2}{2p+1}\cdot\frac{(p+q)!}{(p-q)!}\cdot\delta_{pl}, \quad \text{(C2)}$$

where $\delta_{pl}$ is the Kronecker delta function, leads to $$(H_r^{(\cdot)})_{RMS} = {}^m\alpha_{pq}^{(\cdot)}\frac{p(p+1)}{2}\sqrt{\frac{1+\delta_{q0}}{2p+1}\cdot\frac{(p+q)!}{(p-q)!}}\cdot\frac{|f_p(kr_0)|}{|kk_2|r_0^2} \quad \text{(C3)}$$

To make $$(H_r^{(\cdot)})_{RMS}=1 \quad \text{(C4)}$$

for this mode, one simply requires that $${}^m\alpha_{pq}^{(\cdot)} = \left[\frac{p(p+1)}{2}\sqrt{\frac{1+\delta_{q0}}{2p+1}\cdot\frac{(p+q)!}{(p-q)!}}\cdot\frac{|f_p(kr_0)|}{|kk_2|r_0^2}\right]^{-1} \quad \text{(C5)}$$

Note that performing the calculation for the negative parity mode (of the same p, q) yields the same result.

Calculation of the RMS value of $E_r$ proceeds along the same lines. In fact, comparing the expressions ${}^e\Pi_{pq}^{(\cdot)}$ and ${}^m\Pi_{pq}^{(\cdot)}$ in Eq. (B5) shows that the e mode relation can be obtained from Eq. (C5) by replacing $kk_2$ by $k^2$:

$${}^e\alpha_{pq}^{(\cdot)} = \left[\frac{p(p+1)}{2}\sqrt{\frac{1+\delta_{q0}}{2p+1}\cdot\frac{(p+q)!}{(p-q)!}}\cdot\frac{|f_p(kr_0)|}{|k|^2 r_0^2}\right]^{-1} \quad \text{(C6)}$$

The scaling constants defined in Eqs. (C5)-(C6) provide a common scale for all wave coefficients and improve the rank of the $\tilde{X}$ and $\tilde{C}$ matrices.

APPENDIX D

The goal here is to show the extent to which measurements of $H_x$ and $H_y$ determine the field modes. To begin, assume the medium is homogeneous, linear, and isotropic. Suppose that two magnetic fields, $\vec{H}_1$ and $\vec{H}_2$ have the same x and y components, but different z components. Since Maxwell's equations are linear, the difference between the two fields must also be a possible field. If $\vec{H} \equiv \vec{H}_1 - \vec{H}_2$, then $H_x=0$ $H_y=0$ $H_z \neq 0$ \quad (D1)

For linear media $\vec{B}=\mu\vec{H}$, so $\nabla\cdot\vec{B}=0$ implies $\nabla\cdot\vec{H}=0$ or $$\frac{\partial H_x}{\partial x}+\frac{\partial H_y}{\partial y}+\frac{\partial H_z}{\partial z}=0 \quad \text{(D2)}$$

Substituting the first two lines of Eq. (D1), one finds $$\frac{\partial H_z}{\partial z}=0 \quad \text{(D3)}$$

so the z component of $\vec{H}$ must be independent of z. According to Eq. (8), each Cartesian component of $\vec{H}$ satisfies the wave equation. In particular, $$\nabla^2 H_z + k^2 H_z = 0 \quad \text{(D4)}$$

$$\left(\frac{\partial^2}{\partial x^2}+\frac{\partial^2}{\partial y^2}\right)H_z + k^2 H_z = 0$$

using Eq. (D3). Hence, the $\vec{H}_1$ and $\vec{H}_2$ fields can differ by any $H_z$ that satisfies the wave equation in the xy plane, but is independent of z. It follows that measurements of $H_x$ and $H_y$ determine the total field, up to the contribution of an arbitrary wave propagating in the xy plane with $\vec{H}$ parallel to $\hat{z}$. Since these fields have negligible effect on spins, one can ignore them. Hence, when estimating the field modes that produce the measured values of $H_x$ and $H_y$, one can look for the minimum-norm solution for the Debye potentials that are consistent with the measurements. The estimated field may differ from the true field by an arbitrary $H_z$ wave propagating in the xy plane.

APPENDIX E

Once the mode coefficients have been determined for a specific wave, for example a plane wave propagating in the +z direction, it is straightforward to calculate the coefficients for the corresponding rotated wave. This can be done by writing the mode functions, Eq. (14), in terms of spherical harmonics and using the rotational properties of the spherical harmonics to find the mode functions in the relevant rotated coordinate frame. If the original coefficients for a specific wave (incident, scattered or within the object) and source type (m or e) are $\{a_{pq}, b_{pq}\}$, then the coefficients $\{a'_{pq}, b'_{pq}\}$ for the rotated wave are $$a'_{pq} = \frac{(-1)^q}{\sqrt{1+\delta_{q0}}}\sum_{q'=0}^{p}\frac{1}{\sqrt{1+\delta_{q'0}}} \quad \text{(E1)}$$

$$\{a_{pq'}[(-1)^{q'}\text{Re}[D_{q,q'}^p(\gamma,\beta,\alpha)]+\text{Re}[D_{q,-q'}^p(\gamma,\beta,\alpha)]]+$$

$$b_{pq'}[(-1)^{q'}\text{Im}[D_{q,q'}^p(\gamma,\beta,\alpha)]-\text{Im}[D_{q,-q'}^p(\gamma,\beta,\alpha)]]\}$$

$$b'_{pq} = \frac{(-1)^q}{\sqrt{1+\delta_{q0}}}\sum_{q'=0}^{p}\frac{1}{\sqrt{1+\delta_{q'0}}}$$

$$\{-a_{pq'}[(-1)^{q'}\text{Im}[D_{q,q'}^p(\gamma,\beta,\alpha)]+\text{Im}[D_{q,-q'}^p(\gamma,\beta,\alpha)]]+$$

$$b_{pq'}[(-1)^{q'}\text{Re}[D_{q,q'}^p(\gamma,\beta,\alpha)]-\text{Re}[D_{q,-q'}^p(\gamma,\beta,\alpha)]]\}$$

if the original wave is rotated by angle α around the z axis, then by β around the y axis, then by γ again around the z axis to get the final rotated wave. In this expression $D_{qq'}^P(\gamma,\beta,\alpha)$ is the Wigner-D matrix for the specified rotation angles and $\delta_{qr}$ is the Kronecker delta function.

Two special cases of the general relation Eq. (E1) are of note. First, rotating the wave by $-\pi/2$ around the z axis transforms the coefficients as follows:

$$a'_{pq} = a_{pq}\cos\left(q\frac{\pi}{2}\right) + b_{pq}\sin\left(q\frac{\pi}{2}\right) \quad (E1)$$
$$b'_{pq} = -a_{pq}\sin\left(q\frac{\pi}{2}\right) + b_{pq}\cos\left(q\frac{\pi}{2}\right)$$

This relation can be used to transform the coefficients for a plane wave with magnetic field polarized in y to the corresponding wave with x magnetic field polarization. The second wave, phase shifted by $\pm\pi/2$ and added to the first produces a circularly polarized plane wave. A second useful transformation is a rotation by $\pi$ around the x axis. In this case, Eq. (E1) yields $$a'_{pq} = (-1)^{p+q} a_{pq}$$
$$b'_{pq} = -(-1)^{p+q} b_{pq} \quad (E2)$$

This can be used to transform the coefficients for a plane wave propagating along +z (from head to foot) to the corresponding wave propagating along −z (from foot to head).

What is claimed is:

1. A method for operating a magnetic resonance apparatus, comprising the steps of:
generating, via a coil former surrounding a subject or object of interest and disposed in the magnetic resonance apparatus, a plurality of external field modes;
measuring for each of the plurality of external field modes, an associated internal RF magnetic field produced within the subject or object;
generating, via the coil former, a combination of external modes, using information from the measuring step, to produce a target internal RF magnetic field in the subject or object; and
measuring a nuclear magnetic resonance signal due to the combination of external modes to acquire an image or spectrum of the subject or object.

2. The method of claim 1, wherein the target internal RF magnetic field is one of a traveling wave or a superposition of traveling waves in the subject or object.

3. The method of claim 1, further comprising calculating, based on the measurements, the combination of external modes.

4. The method of claim 3, wherein the coil former comprises an array of dipoles, and wherein the calculating comprises calculating mode amplitudes and phases for the array of dipoles.

5. The method of claim 4, wherein the generating comprises:
producing a single radiofrequency (RF) pulse;
distributing amplitude-modulated and phase-modulated copies of the single RF pulse to the array of dipoles according to the mode amplitudes and phases.

6. The method of claim 4, wherein the array of dipoles comprises at least one of a plurality of magnetic dipoles or a plurality of electric dipoles.

7. The method of claim 1, wherein the external field modes comprise external RF electromagnetic field modes.

8. The method of claim 1, wherein the combination of external modes comprises a combination of external RF electromagnetic field modes.

9. A magnetic resonance apparatus, comprising:
an apparatus body comprising a bore and a scanner;
a coil former disposed in the bore and configured for surrounding a subject or object of interest in the bore; and
a control system coupled to at least the coil former and the apparatus body, wherein the processor comprises a processor and a computer-readable medium having stored thereon a plurality of instructions for causing the processor to perform steps comprising:
generating, via the coil former, a plurality of external field modes;
measuring, via the scanner, for each of the plurality of external field modes, an associated internal RF magnetic field produced within the subject or object;
generating, via the coil former, a combination of external modes, using information from the measuring step, to produce a target internal RF magnetic field in the subject or object; and
measuring, via the scanner, the resulting signal due to the combination of external modes to acquire an image or spectrum of the subject or object.

10. The apparatus of claim 9, wherein the target internal RF magnetic field is an internal RF magnetic field that produces at least one of a traveling wave or a superposition of traveling waves in the subject or object.

11. The apparatus of claim 9, the computer-readable medium having stored thereon instructions for causing the processor to calculate, based on the measuring, the combination of external modes.

12. The apparatus of claim 11, wherein the coil former comprises an array of dipoles, and wherein the calculating comprises calculating mode amplitude and phases for the array of dipoles.

13. The apparatus of claim 12, further comprising a modulation and distribution unit configured for receiving a single radiofrequency (RF) pulse and distributing amplitude-modulated and phase-modulated copies of the single RF pulse to the array of dipoles according to the mode amplitudes and phases.

14. The apparatus of claim 12, wherein the array of dipoles comprises at least one of a plurality of magnetic dipoles or a plurality of electric dipoles.

15. The apparatus of claim 9, wherein the external field modes comprise external RF electromagnetic field modes.

16. The apparatus of claim 9, wherein the combination of external modes comprises a combination of external RF electromagnetic field modes.

17. A non-transitory computer-readable medium, having stored thereon a computer program executable by a computing device for operating a magnetic resonance apparatus, the computer program comprising a plurality of code sections for causing the computing device to perform steps comprising:
generating, via a coil former surrounding a subject or object of interest and disposed in the magnetic resonance apparatus, a plurality of external field modes;
measuring for each of the plurality of external field modes, an associated internal RF magnetic field produced within the subject or object;
generating, via the coil former, a combination of external modes, using information from the measuring step, to produce a target internal RF magnetic field in the subject or object; and measuring a nuclear magnetic resonance signal due to the combination of external modes to acquire an image or spectrum of the subject or object.

18. The non-transitory computer-readable medium of claim 17, wherein the target internal RF magnetic field is one of a traveling wave or a superposition of traveling waves in the subject or object.

19. The non-transitory computer-readable medium of claim 17, the steps further comprising calculating, based on the measurements, the combination of external modes.

20. The non-transitory computer-readable medium of claim 19, wherein the coil former comprises an array of dipoles, and wherein the calculating comprises calculating mode amplitudes and phases for the array of dipoles.

21. The non-transitory computer-readable medium of claim 20, wherein the generating comprises:
producing a single radiofrequency (RF) pulse;
distributing amplitude-modulated and phase-modulated copies of the single RF pulse to the array of dipoles according to the mode amplitudes and phases.

22. The non-transitory computer-readable medium of claim 20, wherein the array of dipoles comprises at least one of a plurality of magnetic dipoles or a plurality of electric dipoles.

23. The non-transitory computer-readable medium of claim 17, wherein the external field modes comprise external RF electromagnetic field modes.

24. The non-transitory computer-readable medium of claim 17, wherein the combination of external modes comprises a combination of external RF electromagnetic field modes.

* * * * *